United States Patent
Lin et al.

(10) Patent No.: US 12,400,867 B2
(45) Date of Patent: Aug. 26, 2025

(54) INTEGRATED CIRCUIT DEVICE

(71) Applicant: TAIWAN SEMICONDUCTOR MANUFACTURING CO., LTD., Hsinchu (TW)

(72) Inventors: Meng-Han Lin, Hsinchu (TW); Chih-Ren Hsieh, Changhua County (TW); Chih-Pin Huang, Hsinchu (TW); Ching-Wen Chan, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/488,505

(22) Filed: Oct. 17, 2023

(65) Prior Publication Data

US 2024/0047219 A1 Feb. 8, 2024

Related U.S. Application Data

(62) Division of application No. 17/574,414, filed on Jan. 12, 2022, now Pat. No. 11,854,823, which is a division of application No. 16/716,151, filed on Dec. 16, 2019, now Pat. No. 11,239,089.

(51) Int. Cl.
| | |
|---|---|
| *H01L 21/3105* | (2006.01) |
| *H01L 21/308* | (2006.01) |
| *H01L 21/762* | (2006.01) |
| *H10B 41/30* | (2023.01) |

(52) U.S. Cl.
CPC .... *H01L 21/31056* (2013.01); *H01L 21/3086* (2013.01); *H01L 21/76283* (2013.01); *H10B 41/30* (2023.02)

(58) Field of Classification Search
None
See application file for complete search history.

(56) References Cited

U.S. PATENT DOCUMENTS

| | | |
|---|---|---|
| 6,200,856 B1 | 3/2001 | Chen |
| 10,937,879 B2 | 3/2021 | Lin et al. |
| 11,854,823 B2 * | 12/2023 | Lin .................. H01L 29/42328 |
| 2007/0029622 A1 * | 2/2007 | Park ...................... H10B 41/40 257/374 |

(Continued)

FOREIGN PATENT DOCUMENTS

CN 109860281 A 6/2019

*Primary Examiner* — Alexander G Ghyka
(74) *Attorney, Agent, or Firm* — Maschoff Brennan

(57) ABSTRACT

An integrated circuit device includes a substrate, an isolation feature, a memory cell, and a semiconductor device. The substrate has a cell region, a peripheral region, and a transition region between the cell region and the peripheral region. The isolation feature is in the transition region. A top surface of the isolation feature has a first portion and a second portion lower than the first portion, the second portion of the top surface of the isolation feature is between the cell region and the first portion of the top surface of the isolation feature, and a bottom surface of the isolation feature has a step height directly below the second portion of the top surface of the isolation feature. The is memory cell over the cell region of the substrate. The semiconductor device is over the peripheral region of the substrate.

20 Claims, 30 Drawing Sheets

(56) References Cited

U.S. PATENT DOCUMENTS

| | | | |
|---|---|---|---|
| 2008/0146000 A1* | 6/2008 | Lee | H10B 41/44 |
| | | | 257/E21.549 |
| 2010/0291750 A1 | 11/2010 | Park | |
| 2017/0162590 A1 | 6/2017 | Chuang et al. | |
| 2018/0315765 A1 | 11/2018 | Lin et al. | |
| 2019/0019805 A1* | 1/2019 | Feng | H10B 12/482 |
| 2019/0103367 A1 | 4/2019 | Chen et al. | |
| 2019/0165115 A1 | 5/2019 | Lin et al. | |

* cited by examiner

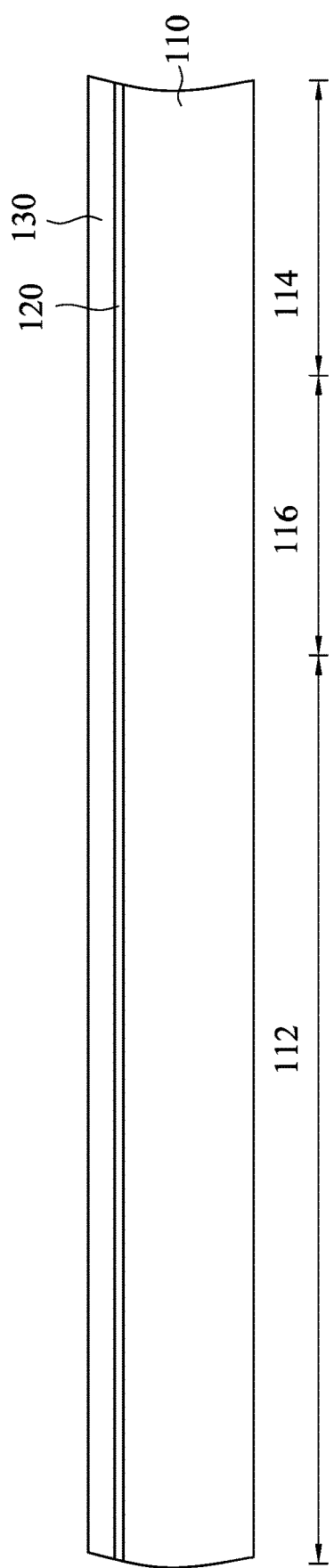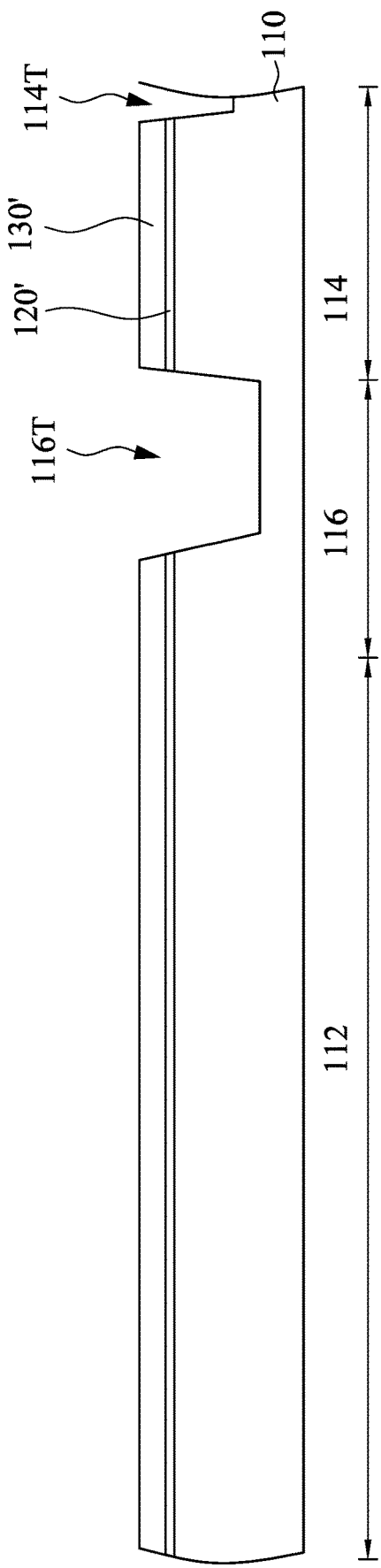
Fig. 2B
Fig. 3

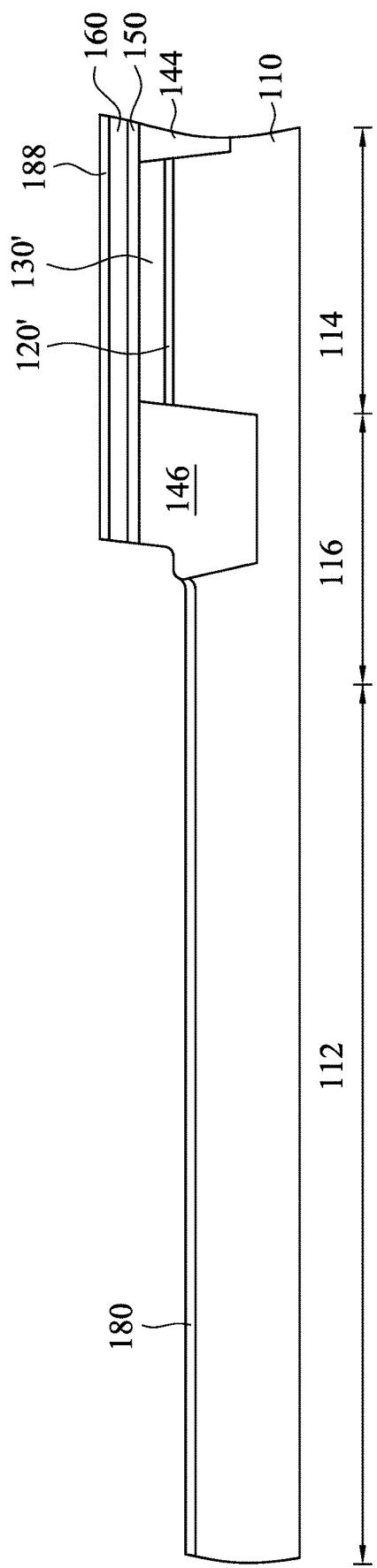
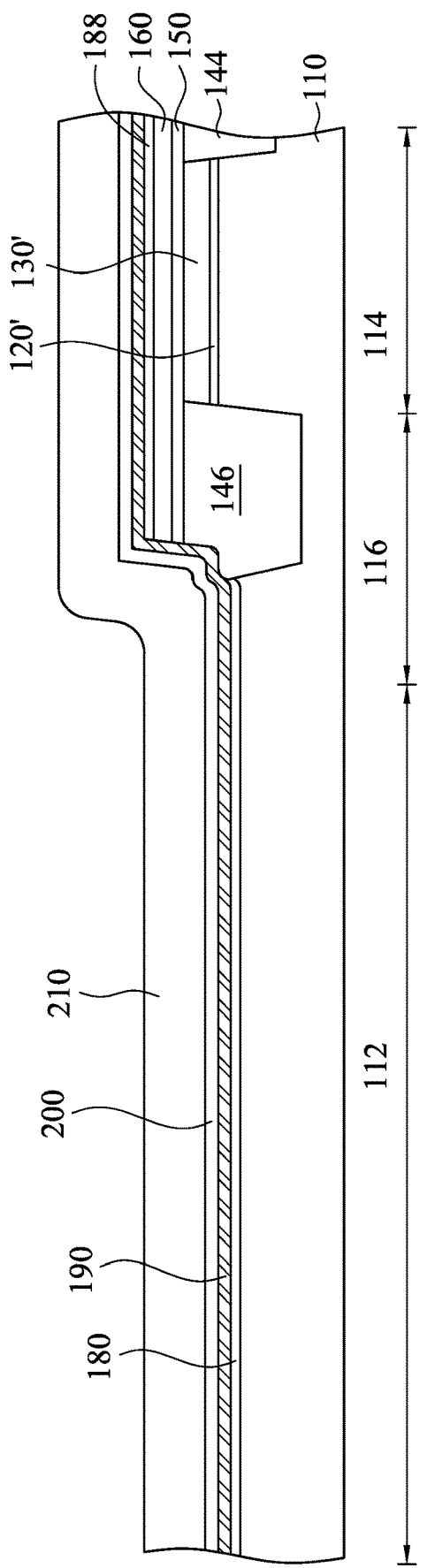

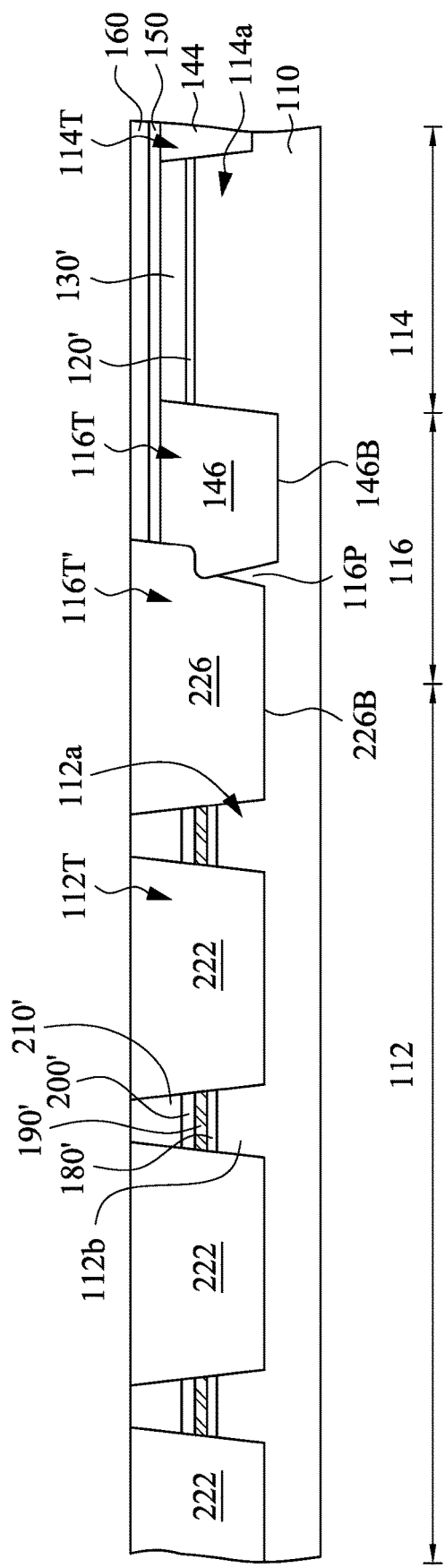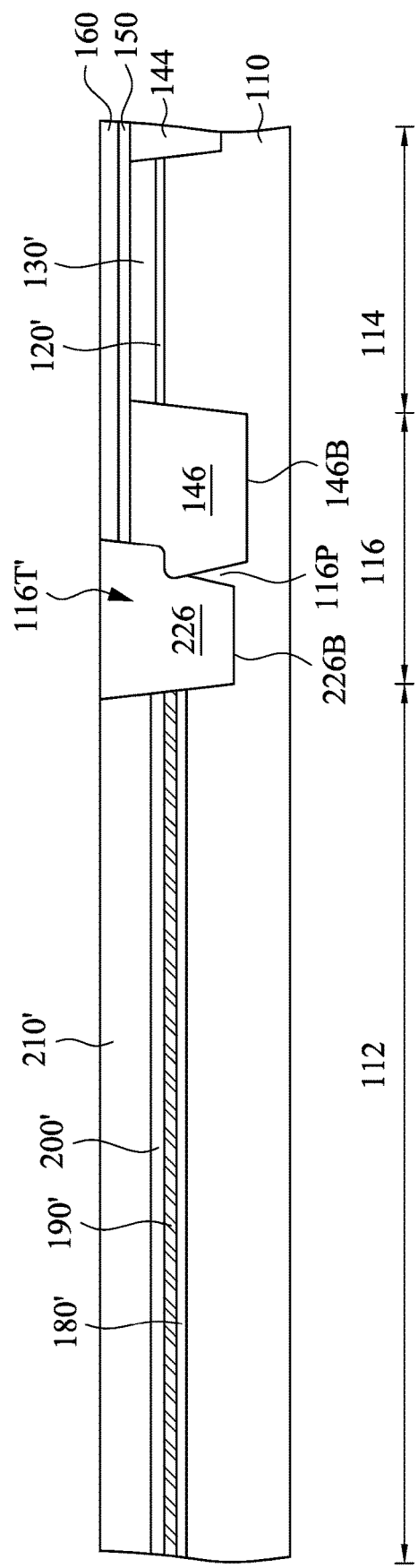

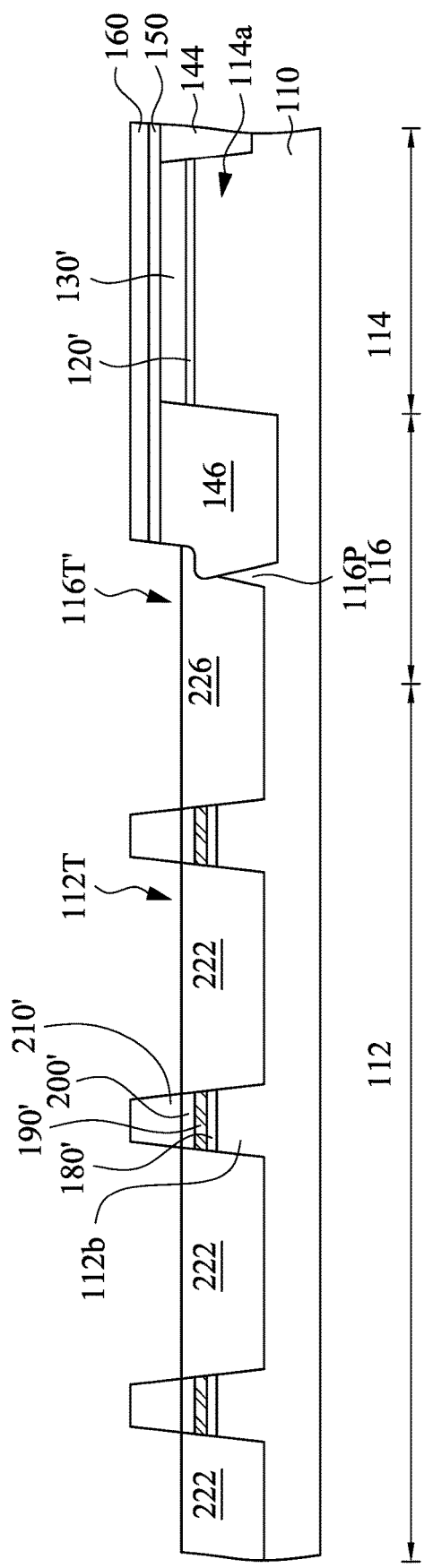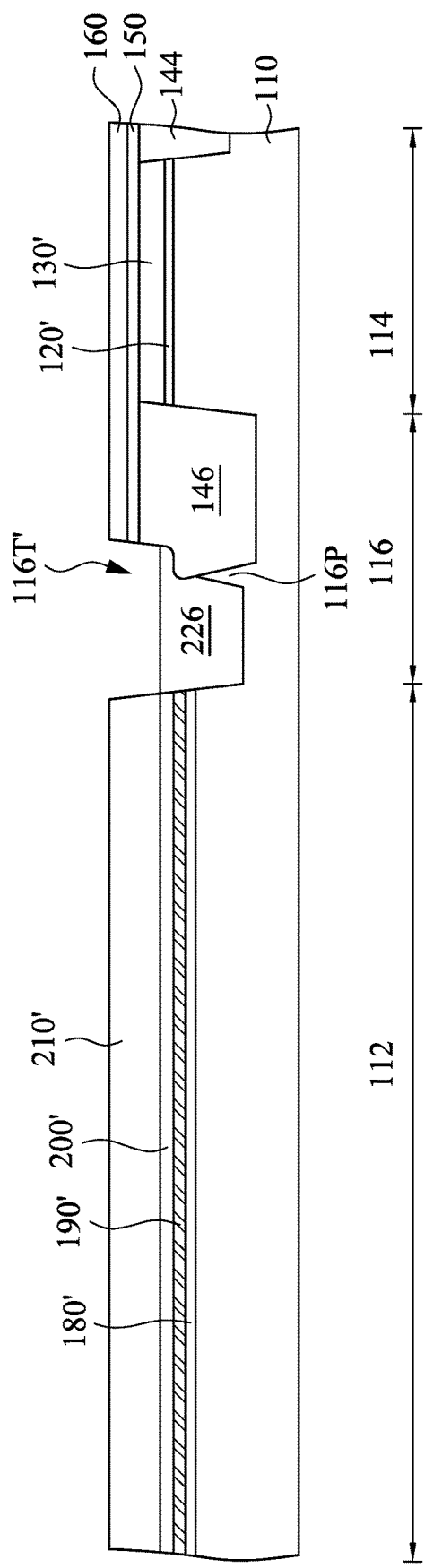
Fig. 12A
Fig. 12B

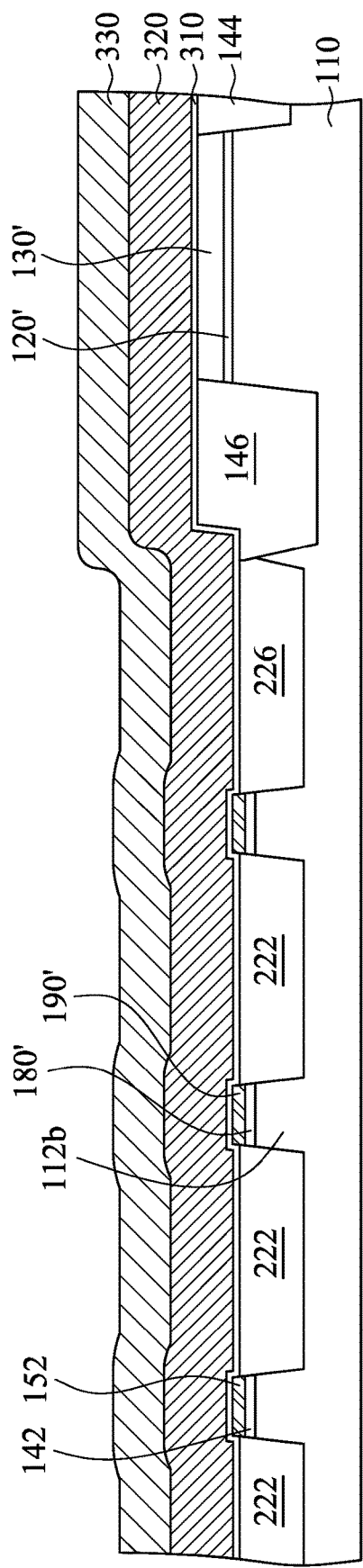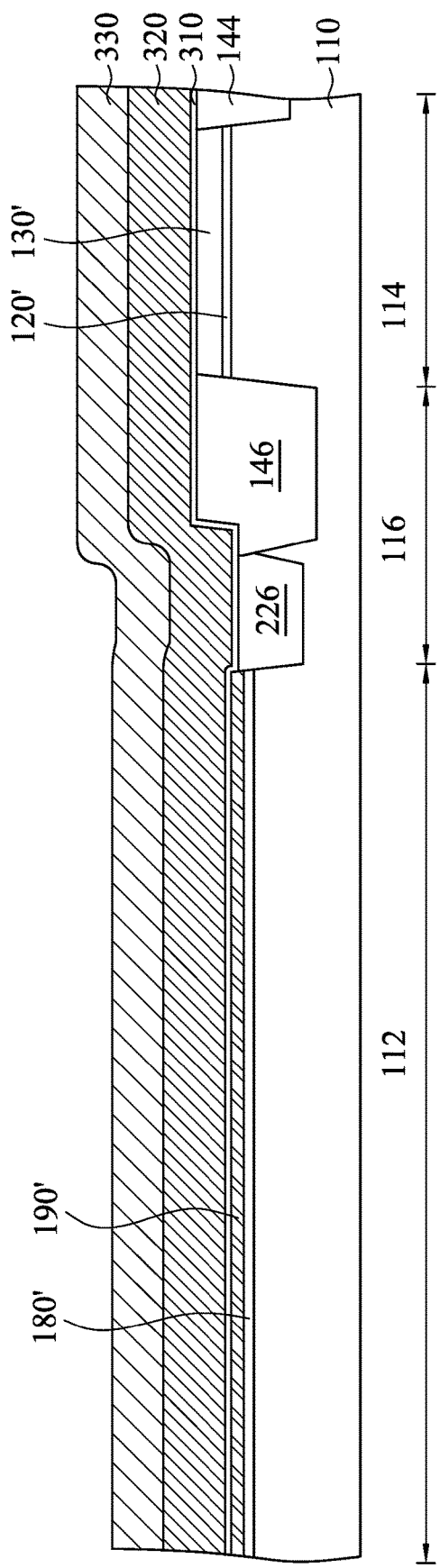
Fig. 15A
Fig. 15B

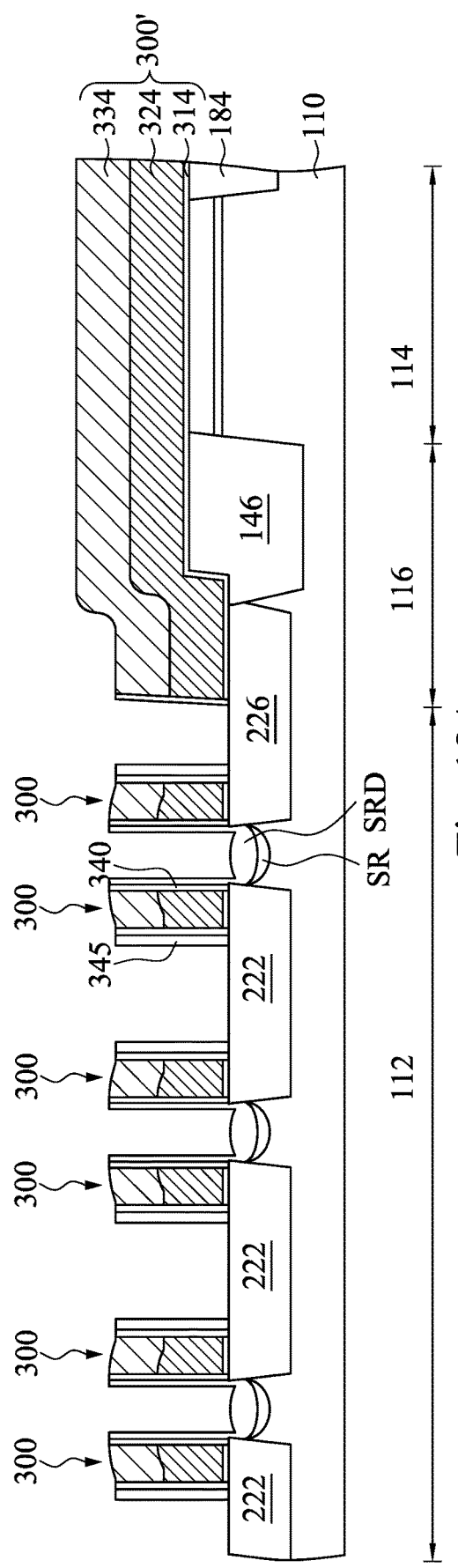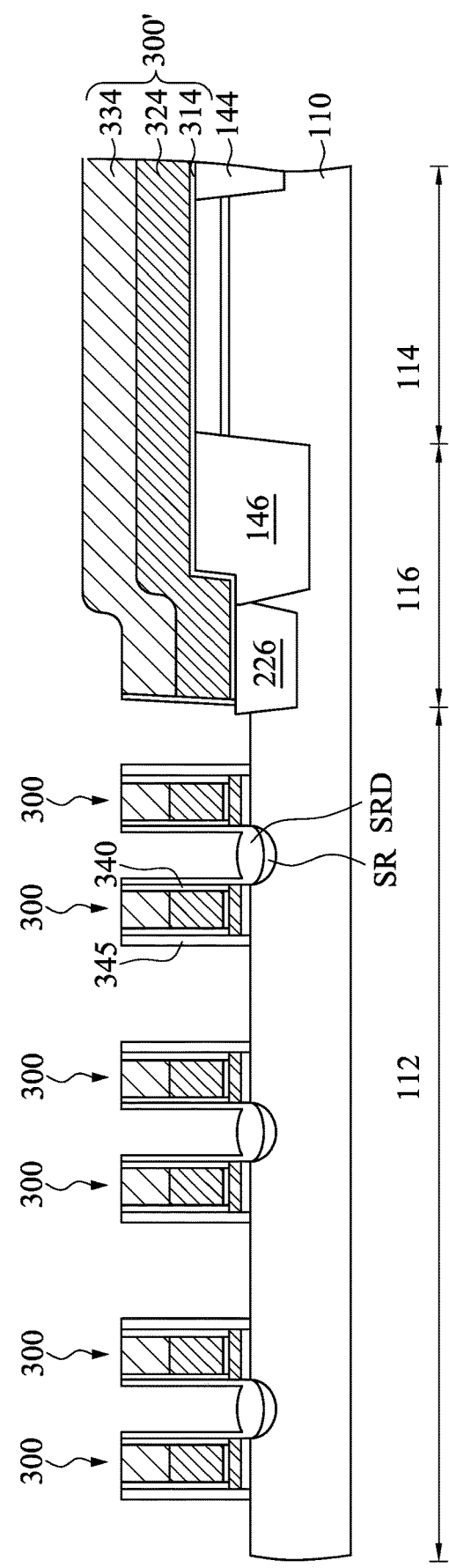
Fig. 18A
Fig. 18B

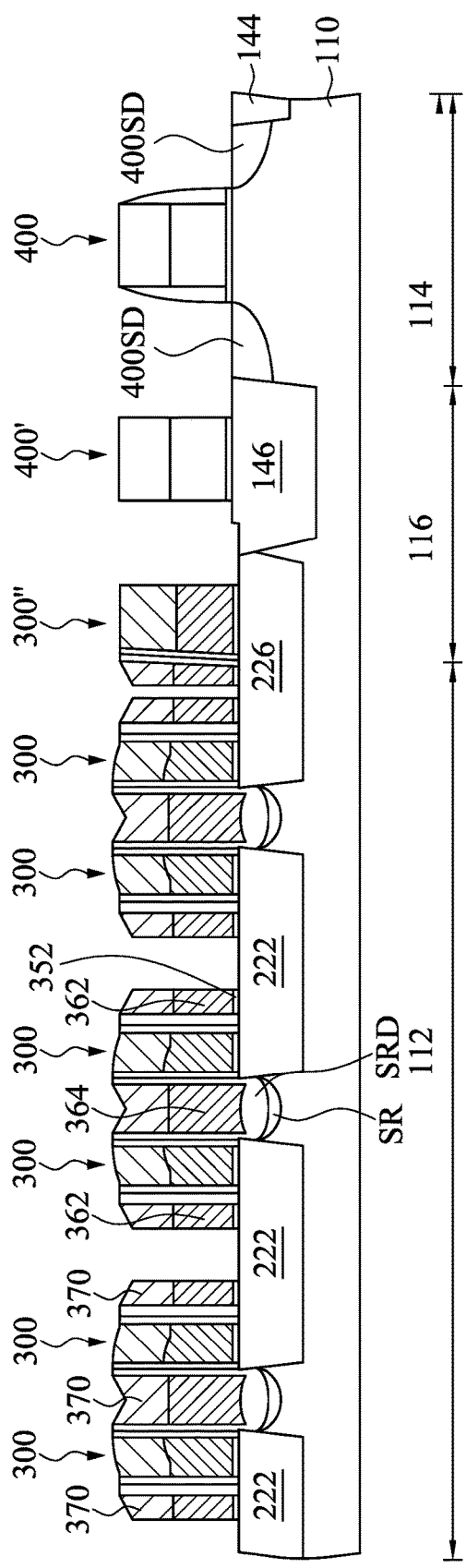
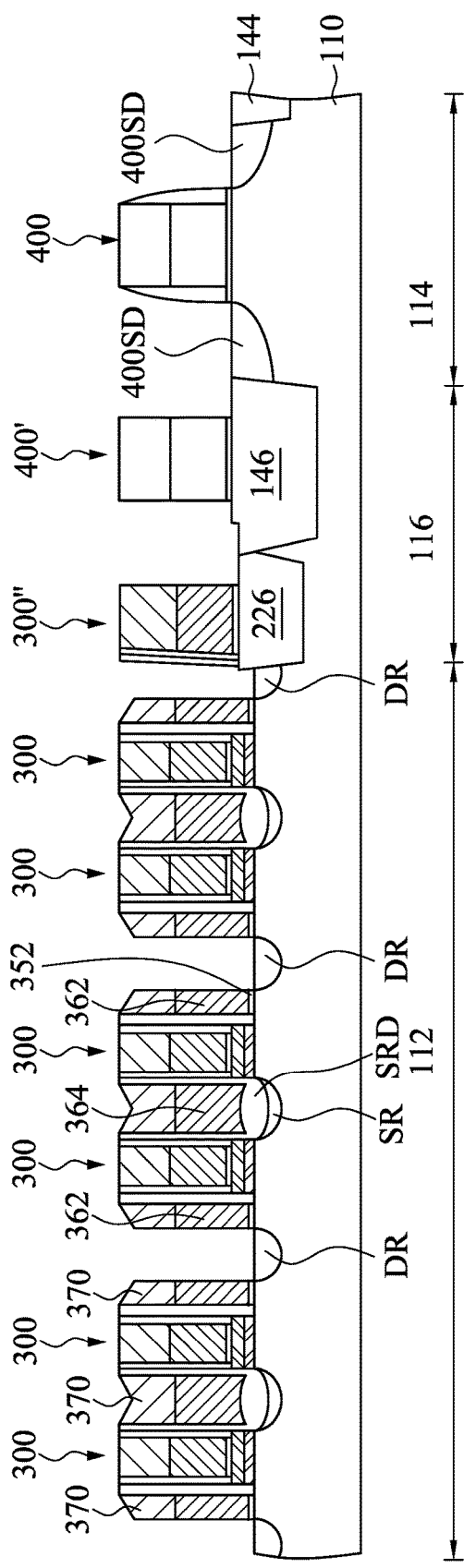
Fig. 20A
Fig. 20B

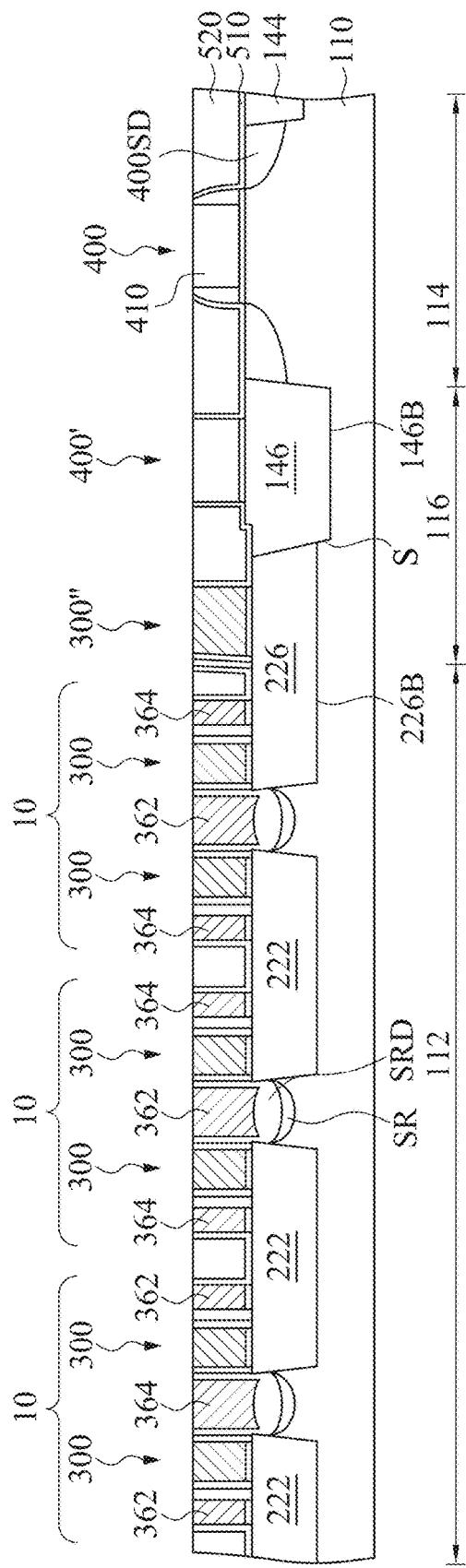
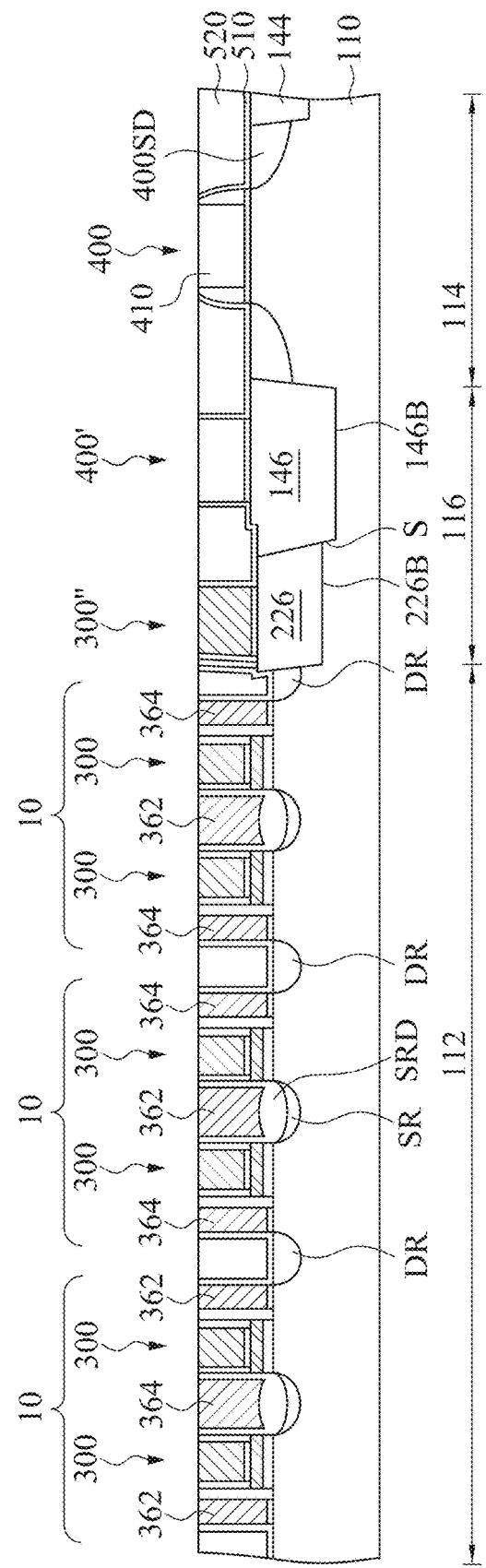
Fig. 22A
Fig. 22B

INTEGRATED CIRCUIT DEVICE

PRIORITY CLAIM AND CROSS-REFERENCE

This application is a divisional application of U.S. patent application Ser. No. 17/574,414, filed Jan. 12, 2022, which is a divisional application of U.S. patent application Ser. No. 16/716,151, filed Dec. 16, 2019, now U.S. Pat. No. 11,239,089, issued Feb. 1, 2022, all of which are herein incorporated by reference in their entireties.

BACKGROUND

The semiconductor integrated circuit (IC) industry has experienced exponential growth over the last few decades. In the course of IC evolution, functional density (i.e., the number of interconnected devices per chip area) has generally increased while geometry size (i.e., the smallest component (or line) that can be created using a fabrication process) has decreased. One advancement implemented as technology nodes shrink, in some IC designs, has been the replacement of the polysilicon gate electrode with a metal gate electrode to improve device performance with the decreased feature sizes.

Super-flash technology has enabled designers to create cost effective and high performance programmable SOC (system on chip) solutions through the use of split-gate flash memory cells. The aggressive scaling of the third generation embedded super-flash memory (ESF3) enables designing flash memories with high memory array density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A to 21C illustrate the method for fabricating a semiconductor device at different stages in accordance with some embodiments.

FIGS. 22A to 22B are cross-sectional views of a semiconductor device in accordance with some embodiments.

DETAILED DESCRIPTION

Figure 1A:
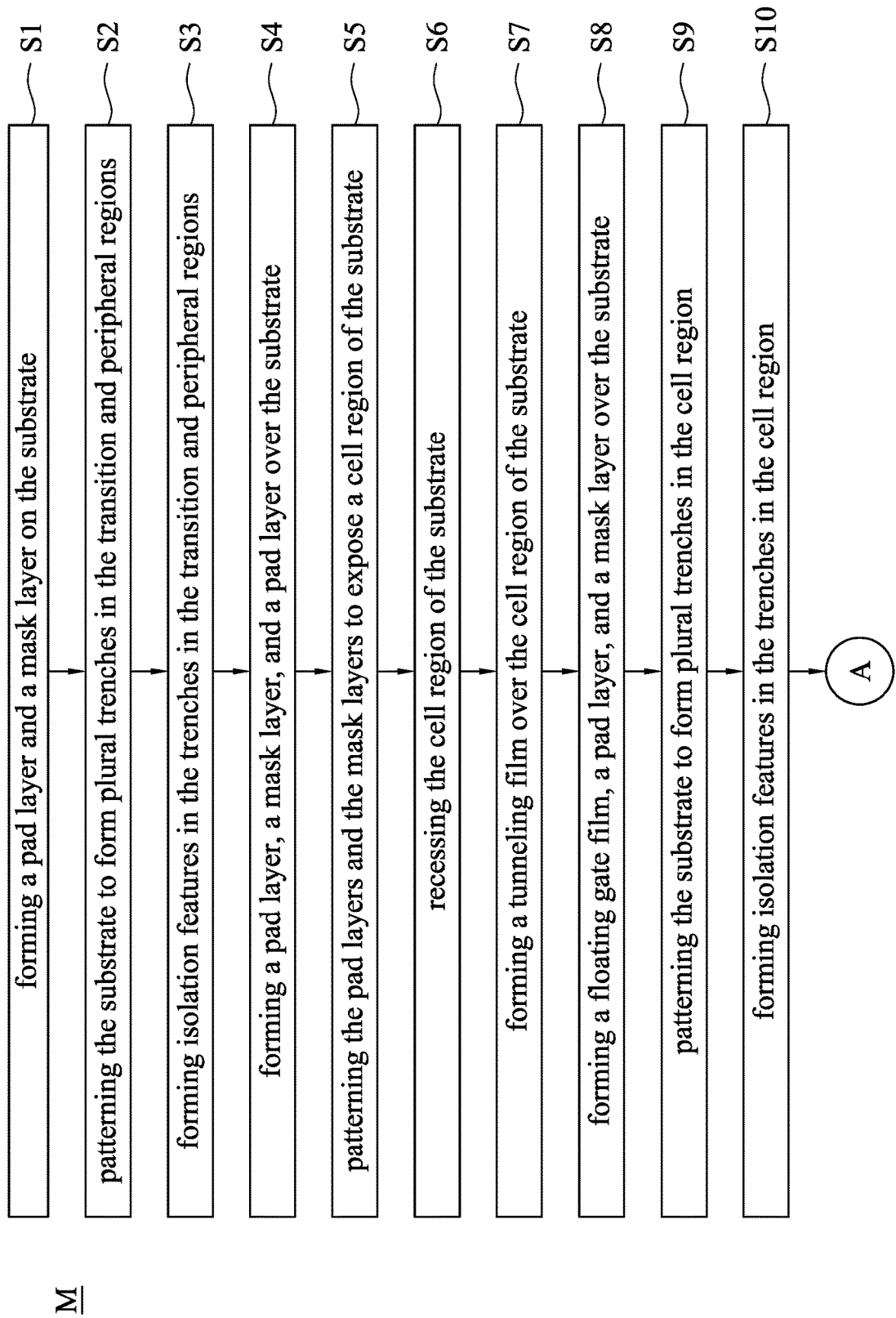
FIGS. 1A and 1B are flow charts of a method for fabricating a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Flash memory can be formed on a bulk silicon substrate and uses various bias conditions to read and write data values. For example, an EFS3 cell—or so-called "third generation SUPERFLASH" cell—includes a pair of symmetric split gate memory cells, each of which includes a pair of source/drain regions with a channel region arranged there between. In the EFS3 architecture, one of the source/drain regions for each of the split gate memory cells is a common source/drain region shared with its neighboring cell, while the other source/drain region is an individual source/drain unique to the cell. Within each split gate cell, a floating gate is arranged over the channel region of the cell, and a control gate is arranged over the floating gate. A select gate is arranged on one side of the floating and control gates (e.g., between an individual source/drain region of the EFS3 cell and a sidewall of the floating and/or control gate). At least one cell is configured to store a variable charge level on its floating gate, wherein the level of this charge corresponds to a data state stored in the cell and is stored in a non-volatile manner so that the stored charge/data persists in the absence of power.

By changing the amount of charge stored on the floating gate, the threshold voltage $V_{th}$ of the memory cell device can be correspondingly changed. For example, to perform a program operation (e.g., write a logical "0", program is 0, $V_{th}$ high) for a cell, the control gate is biased with a high (e.g., at least an order of magnitude higher) voltage relative a voltage applied across the channel region and/or relative to a voltage applied to the select gate. The high bias voltage promotes Fowler-Nordheim tunneling of carriers from the channel region towards the control gate. As the carriers tunnel towards the control gate, the carriers become trapped in the floating gate and alter the $V_{th}$ of the cell. Conversely, to perform an erase operation (e.g., write a logical "1", erase is 1, $V_{th}$ low) for the cell, the erase gate is biased with a high (e.g., at least an order of magnitude higher) voltage relative a voltage applied across the channel region and/or relative to a voltage applied to the control gate. The high bias voltage promotes Fowler-Nordheim tunneling of carriers from the floating gate towards the erase gate, thereby removing carriers from the floating gate and again changing the $V_{th}$ of the cell in a predictable manner. Subsequently, during a read operation, a voltage is applied to the select gate to induce part of the channel region to conduct. Application of a voltage to the select gate attracts carriers to part of the channel region adjacent to the select gate. While the select gate voltage is applied, a voltage greater than $V_{th}$, but less than $V_{th}+\Delta V_{th}$, is applied to the control gate (where $\Delta V_{th}$ is a change in $V_{th}$ due to charge trapped on the floating gate). If the memory cell device turns on (i.e., allows charge to flow), then it is deemed to contain a first data state (e.g., a logical "1" is read). If the memory cell device does not turn on, then it is deemed to contain a second data state (e.g., a logical "0" is read).

Due to the high-voltages involved in performing program and/or erase operations, high energy implants are used in some instances to form the source/drain regions of the flash memory cells. Thus, the source/drain regions of the flash cells can be implanted deeper than that of low-voltage CMOS devices. This additional implant depth can help to reduce current crowding at the substrate surface near edges of the source/drain regions.

Some embodiments of the present disclosure relate to flash memory devices that are formed on a recessed region of a substrate. Although some implementations are illustrated below with regards to split gate flash memory, it will be appreciated that this concept is not limited to split gate flash memory cells, but is also applicable to other types of flash memory cells as well as to other types of semiconductor devices, such as MOSFETs, FinFETs, and the like.

Figure 1B:
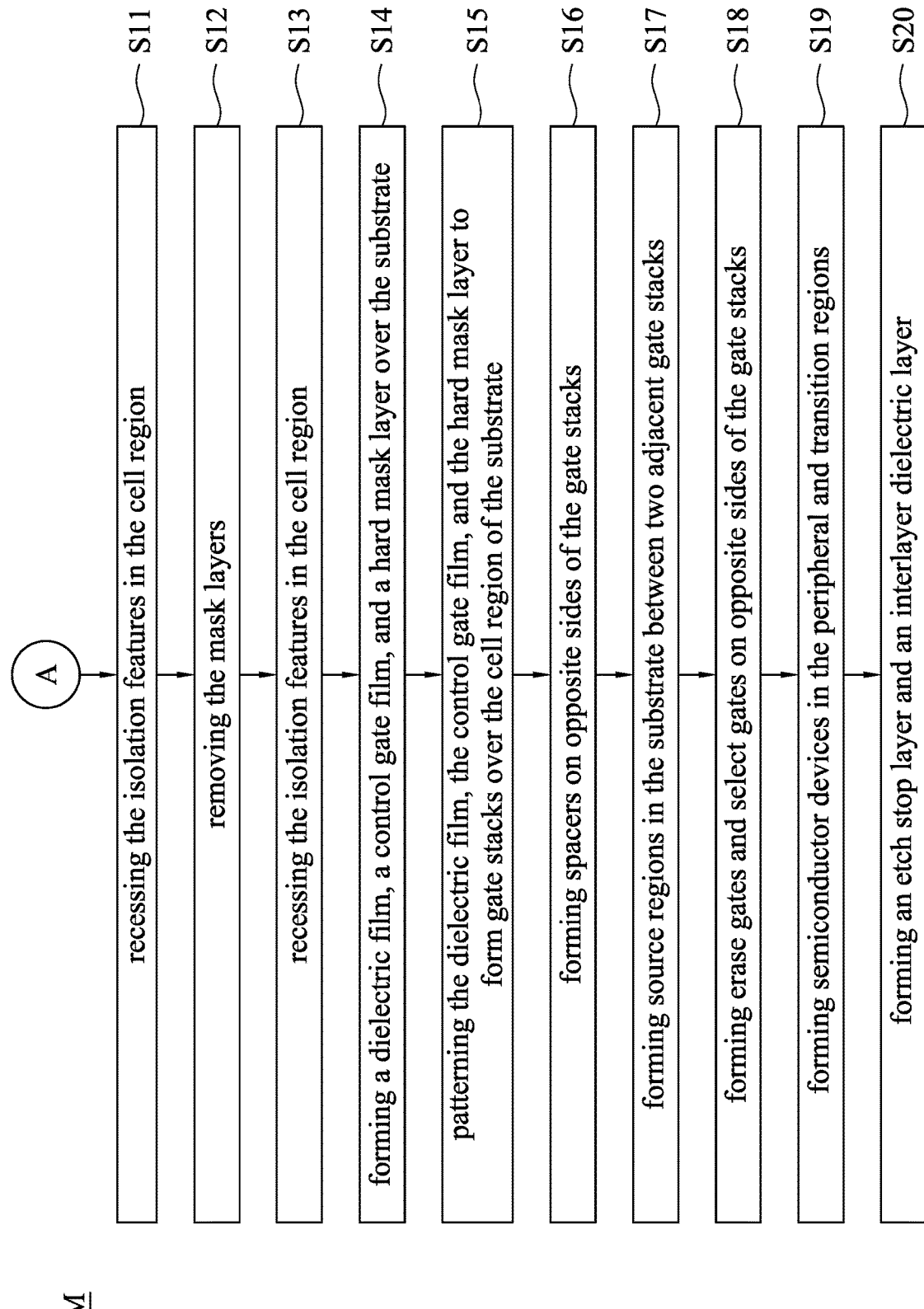

FIGS. 1A and 1B are flow charts of a method M for fabricating a semiconductor device at different stages in accordance with some embodiments. FIGS. 2A to 21C illustrate the method for fabricating a semiconductor device at different stages in accordance with some embodiments. It is understood that additional steps may be implemented before, during, or after the method M, and some of the steps described may be replaced or eliminated for other embodiments of the method M.

Figure 2A:
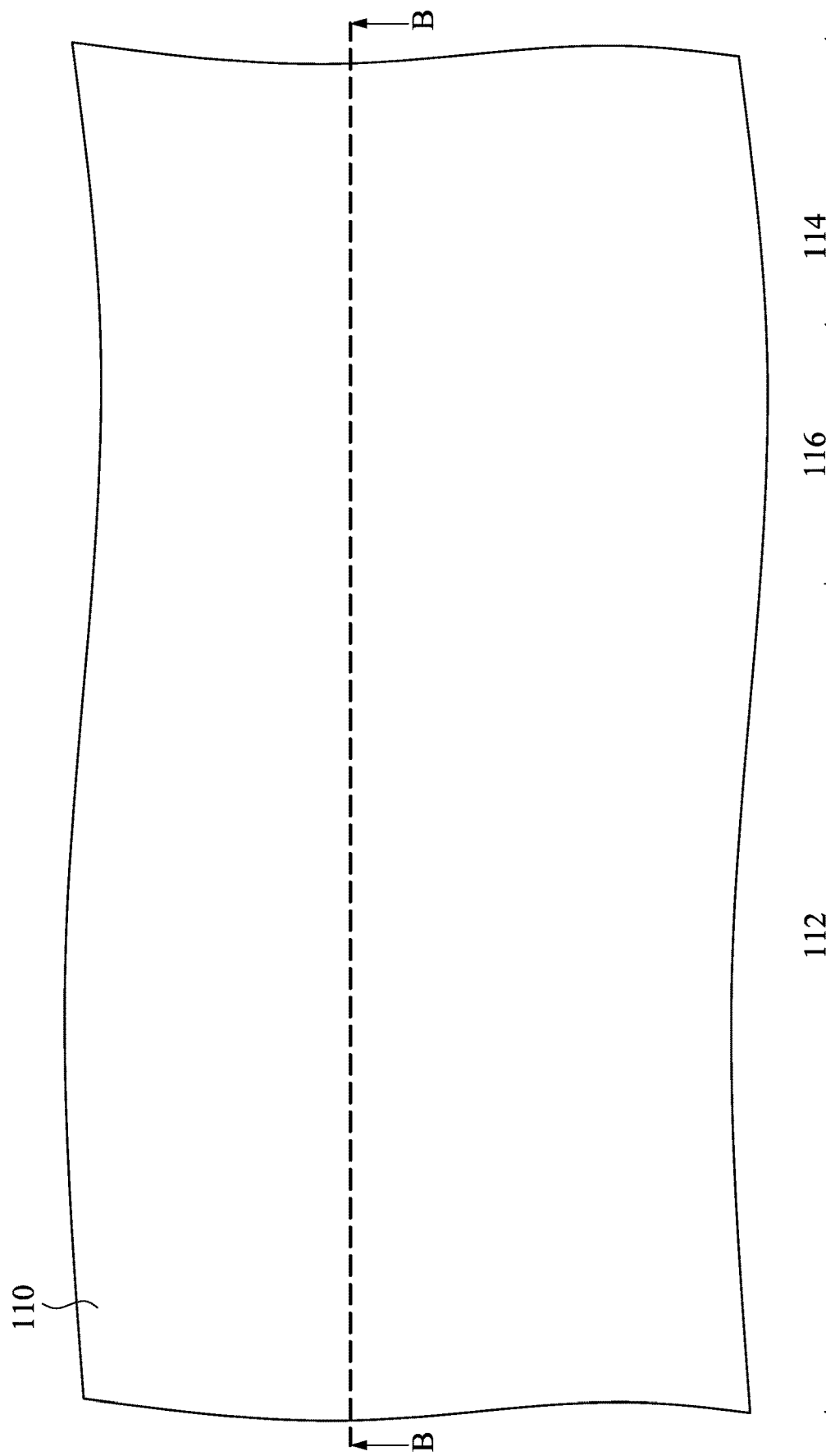

FIG. 2A is a top view of the semiconductor device according with some embodiments, and FIG. 2B is a cross-sectional view taking along line B-B of FIG. 2A. Referring to FIG. 1A and FIGS. 2A and 2B, the method M begins at step S1 where a substrate 110 is provided, and a pad layer 120 and a hard mask layer 130 are formed on the substrate 110. In some embodiments, the substrate 110 can be a semiconductor substrate, such as a bulk silicon substrate, a germanium substrate, a compound semiconductor substrate, or other suitable substrate. The substrate 110 may include an epitaxial layer overlying a bulk semiconductor, a silicon germanium layer overlying a bulk silicon, a silicon layer overlying a bulk silicon germanium, or a semiconductor-on-insulator (SOI) structure. The substrate 110 includes a cell region 112, a peripheral region 114, and a transition region 116. The peripheral region 114 is located at at least one edge of the cell region 112. For example, the peripheral region 114 surrounds the cell region 112. The transition region 116 is disposed between the cell region 112 and the peripheral region 114.

The pad layer 120 may be a thin film comprising silicon oxide formed using, for example, a thermal oxidation process. The pad layer 120 may act as a buffer layer between the substrate 110 and hard mask layer 130. The pad layer 120 may also act as an etch stop layer for etching the hard mask layer 130 in subsequent process. In some embodiments, the hard mask layer 130 is formed of dielectric material, such as silicon nitride, for example, using low-pressure chemical vapor deposition (LPCVD) or plasma enhanced chemical vapor deposition (PECVD). For example, the pad layer 120 may have a thickness in a range from about 30 angstroms to about 300 angstroms.

Referring to FIG. 1A and FIG. 3, where the cross-sectional position of FIG. 3 is the same as the cross-sectional position of FIG. 2B. The method M proceeds to step S2 where the substrate 110 is patterned to form plural trenches in the transition and peripheral regions. In the present embodiments, the pad layer 120, the hard mask layer 130 (referring to FIG. 2B) are patterned to form a patterned pad layer 120' and a patterned hard mask layer 130', respectively, and the substrate 110 is patterned to form a trench 116T in the transition region 116 and at least one trench 114T in the peripheral region 114.

For example, a photoresist layer is formed on the hard mask layer 130 (referring to FIG. 2B) and then patterned by photolithography processes, forming openings in the photoresist layer, such that some regions of the hard mask layer 130 (referring to FIG. 2B) above the peripheral region 114 and the transition region 116 of the substrate 110 are exposed by the photoresist layer. The exposed portions of the hard mask layer 130 and the underlying pad layer 120 (referring to FIG. 2B) are etched and removed, and the remaining hard mask layer 130 and the underlying pad layer 120 (referring to FIG. 2B) are referred to as a patterned hard mask layer 130' and a patterned pad layer 120'. The patterned hard mask layer 130' cover the cell region 112 and portions of the peripheral region 114 of the substrate 110 and exposes portions of the peripheral region 114 and the transition region 116 of the substrate 110. The exposed portions of the peripheral region 114 and the transition region 116 of the substrate 110 are then etched using the patterned hard mask layer 130' as etch mask, for example, by dry etching such as reactive-ion etching (RIE) or by wet etching using a liquid substrate etchant. For example, gas etchants like HBr, and $Cl_2$, may be used in the etching the substrate 110, and the hard mask layer 130' may have a higher etch resistance to the etchant than that of the substrate 110. Through the etching process, trenches 114T and 116T are formed.

Figure 4A:
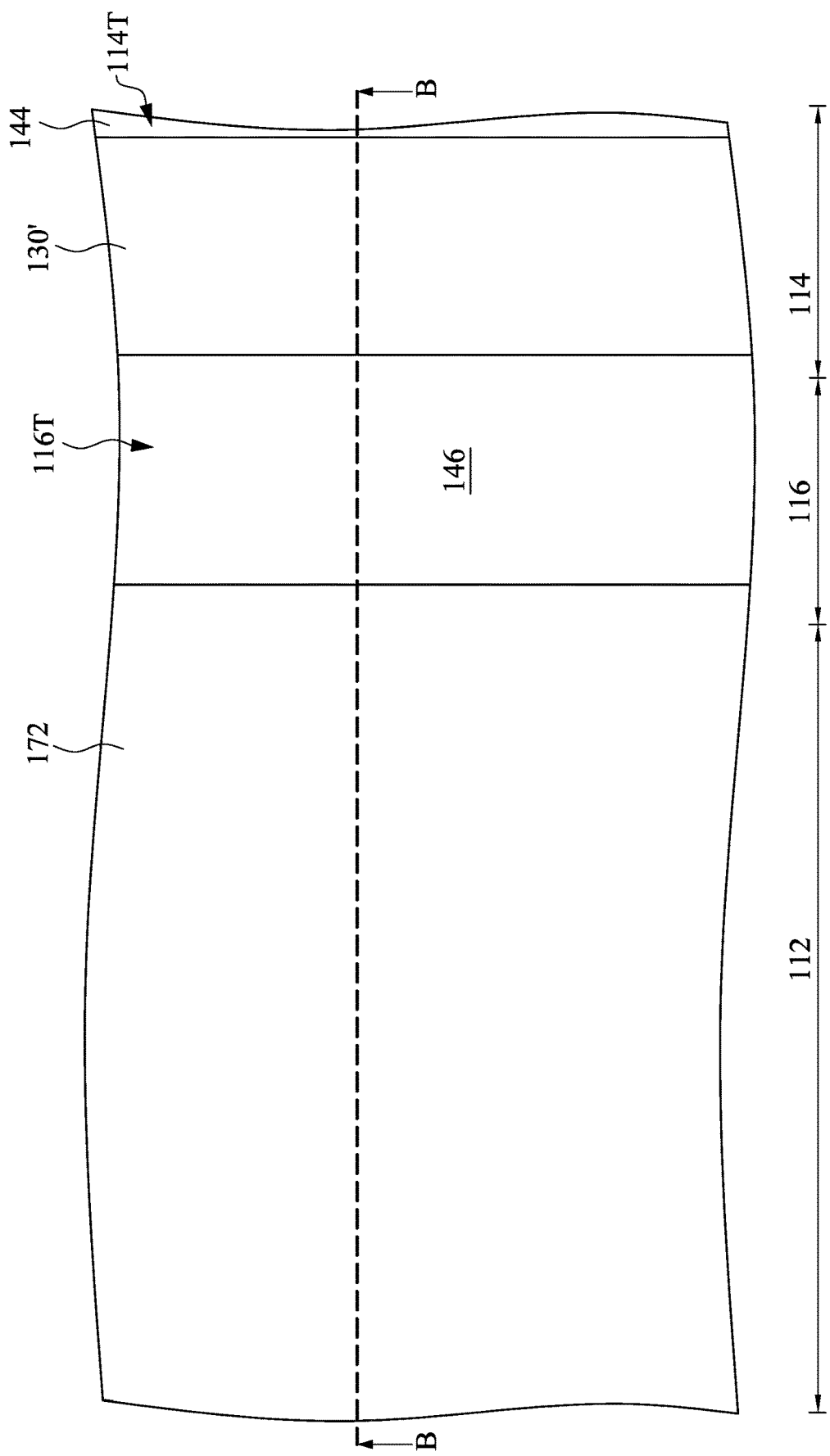
Figure 4B:
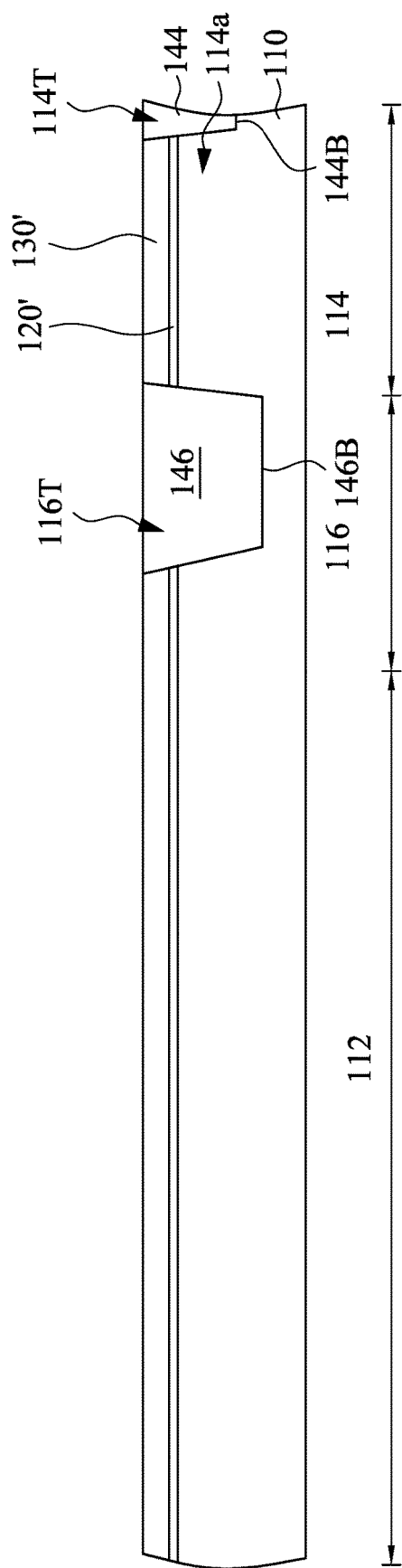

Referring to FIG. 1A and FIGS. 4A and 4B, where FIG. 4A is a top view of the semiconductor device according with some embodiments, and FIG. 4B is a cross-sectional view taking along line B-B of FIG. 4A. The method M proceeds to step S3 where isolation features are formed in the trenches in the transition and peripheral regions. In the present embodiments, isolation features 144 and 146 are formed in the trenches 114T and 116T, respectively. The isolation features 144 and 146 define an active region 114a in the peripheral region 114. It is noted that the number of the isolation feature 144 can be plural in some other embodiments, and the plural isolation features 144 may define plural active regions 114a in the peripheral region 114. In some embodiments, the isolation features 144 and 146 are made of silicon oxide, silicon nitride, silicon oxynitride, fluoride-doped silicate glass (FSG), or other low-K dielectric materials. In the present embodiments, the opening sizes of the trenches 114T and 116T may result in loading effect in etching process, such that a bottom of the trench 116T is lower than a bottom of the trench 114T, and therefore a bottom surface 146B of the isolation feature 146 is lower than a bottom surface 144B of the isolation feature 144.

In some embodiments, a dielectric material may be formed over the structure of FIG. 3 by suitable process, such as a high-density-plasma (HDP) chemical vapor deposition (CVD) process, a sub-atmospheric CVD (SACVD) process, a high aspect-ratio process (HARP), a spin-on-dielectric (SOD) process or other suitable process. The dielectric material may overfill the trenches 114T and 116T. In some embodiments, a liner oxide (not shown) may be formed optionally in advance. In some embodiments, the liner oxide may be a thermal oxide. A chemical mechanical polish (CMP) process is then performed to remove the excess dielectric material outside the trenches 114T and 116T, and the CMP process may level the top surface of the dielectric material to the top surfaces of the patterned hard mask layer 130', thereby forming the isolation features 144 and 146.

Figure 5:
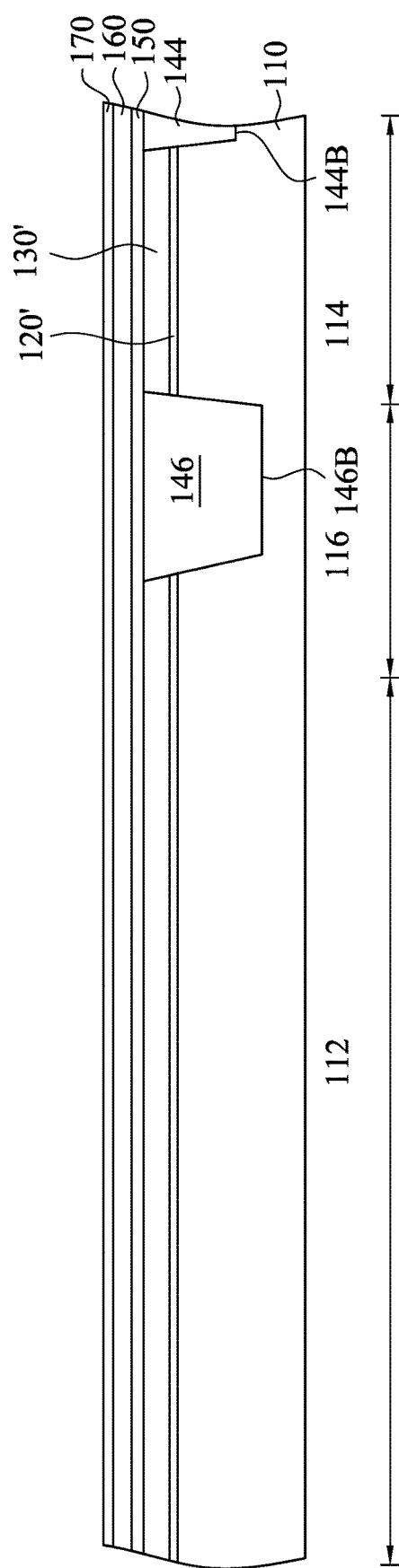

Referring to FIG. 1A and FIG. 5, where the cross-sectional position of FIG. 5 is the same as the cross-sectional position of FIG. 4B. The method M proceeds to step S4 where a pad layer, a hard mask layer, and a pad layer are formed over the substrate. In the present embodiments, a pad layer 150, a hard mask layer 160, and a pad layer 170 are formed over the substrate 110 in a sequence. The pad layers 150 and 170 may be formed of dielectric material, such as an oxide layer. The pad layer 150 may act as a buffer layer. The hard mask layer 160 is formed over the pad layer 150. In some embodiments, the hard mask layer 160 is formed of dielectric material, such as silicon nitride (SiN) or other suitable materials. The pad layer 170 is formed over the hard mask layer 160. The pad layer 150, the hard mask layer 160, and the pad layer 170 are formed to be protection layers for the peripheral region 114 in the following etching process.

Figure 6A:
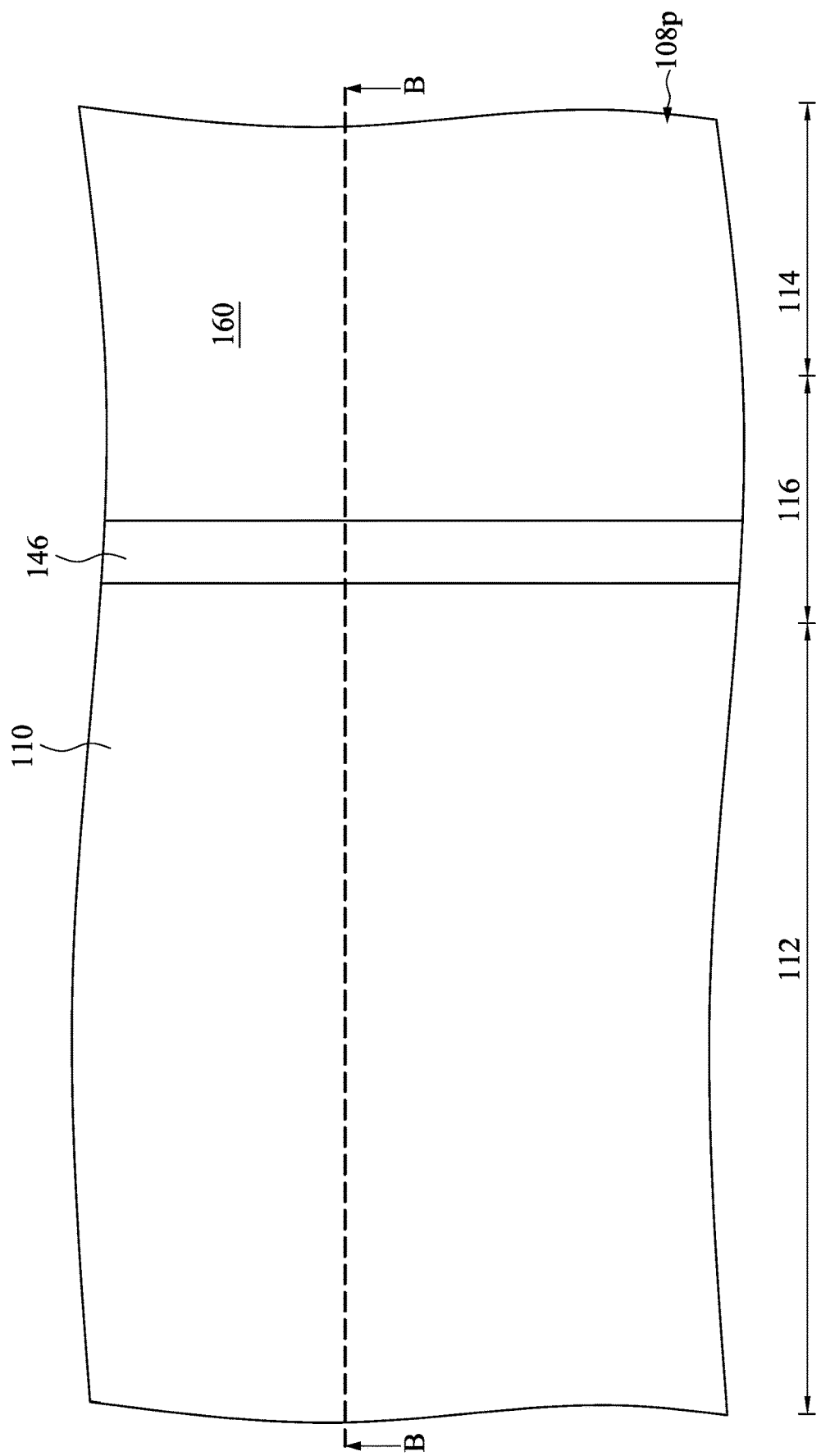
Figure 6B:
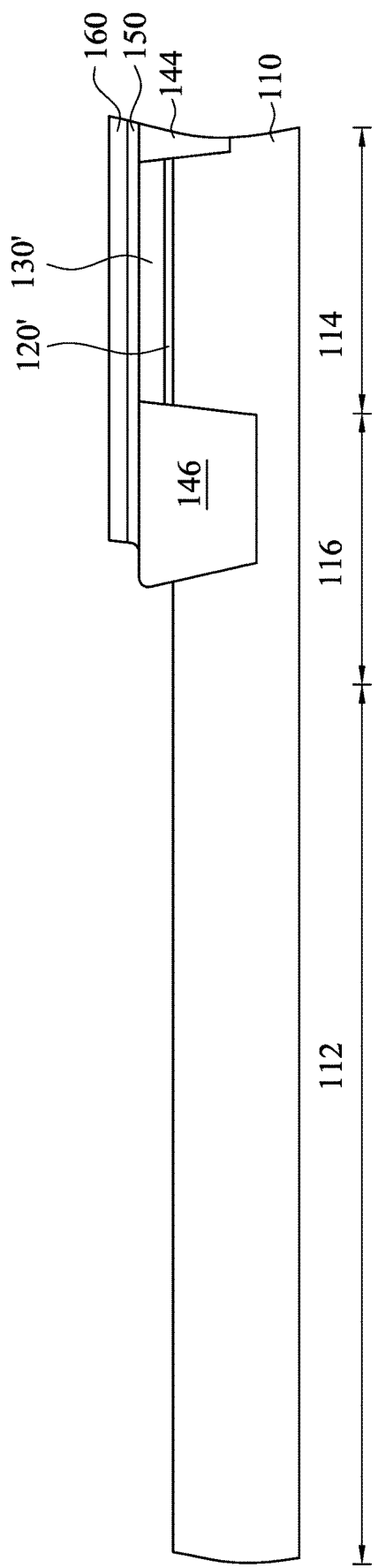

Referring to FIG. 1A and FIGS. 6A and 6B, where FIG. 6A is a top view of the semiconductor device, FIG. 6B is a cross-sectional view taking along line B-B of FIG. 6A. The method M proceeds to step S5 where the pad layers and the hard mask layers are patterned to expose a cell region of the substrate 110. In the present embodiments, the layers 150 to 170, the hard mask layer 130', and the pad layer 120' are patterned by suitable etching processes, such that portions of the pad layer 170, the hard mask layer 160, the pad layer 150, the hard mask layer 130', and the pad layer 120' over the cell region 112 are removed. For example, a photoresist layer is formed on the pad layer 170 (referring to FIG. 5) and then patterned by photolithography processes, forming openings in the photoresist layer, such that some regions of the pad layer 170 (referring to FIG. 5) above the cell region 112 of the substrate 110 is exposed by the photoresist layer. The patterning process includes etching the exposed portions of the pad layer 170 and the underlying layers 150 and 160, 130' and 120' (referring to FIG. 5). After the etching processes, the cell region 112 of the substrate 110 is exposed. The etching processes may also remove the pad layer 170 (referring to FIG. 5) over the peripheral region 114 and the transition region 116. The remaining hard mask layer 160 covers the peripheral region 114 and a portion of the transition region 116. In some embodiments, a portion of the isolation feature 146 not covered by the hard mask layer 160 may be etched. For example, the etching process may smooth the corner of the isolation feature 146 not covered by the hard mask layer 160.

Figure 7:
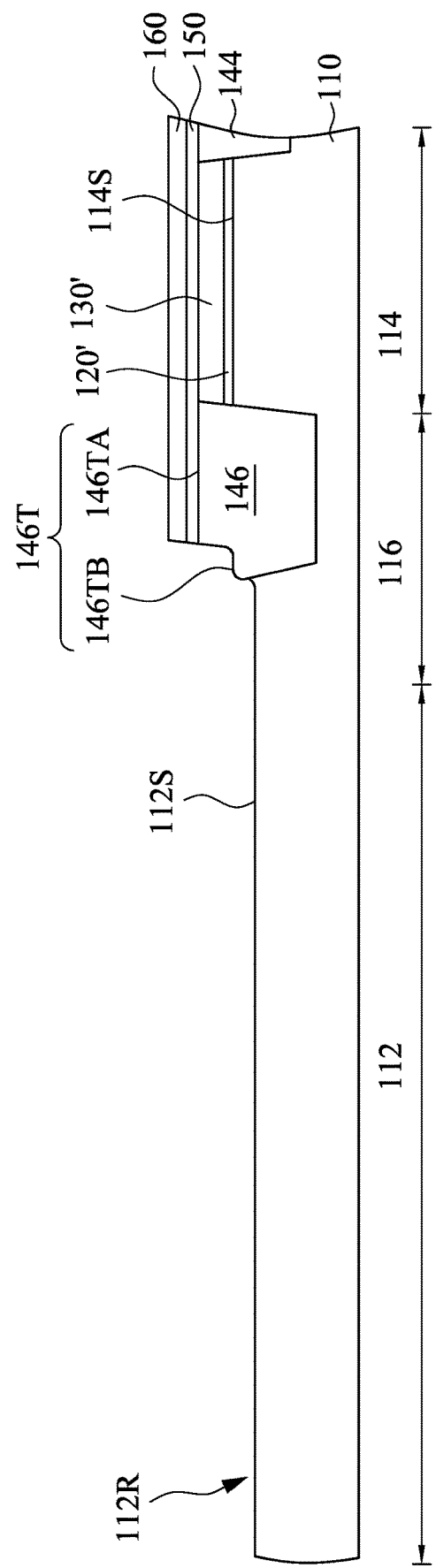

Referring to FIG. 1A and FIG. 7, where the cross-sectional position of FIG. 7 is the same as the cross-sectional position of FIG. 6B. The method M proceeds to step S6 where the cell region of the substrate is recessed. In the present embodiments, the cell region 112 of the substrate 110 is recessed. For example, a surface layer of the exposed region of the substrate 110 not covered by the hard mask layer 160 is oxidized using, for example, wet oxidation. Thereafter, the oxidized surface layer is removed from the substrate 110 using, for example, wet etching, dry etching, or a combination of wet etching and dry etching. Etchants in the wet and/or dry etching process may include HF or other suitable etchants. The removal of oxidized surface layer results in the recess 112R in the cell region 112. For example, a top surface 112S of the cell region 112 is lower than a top surface 114S of the peripheral region 114. In some embodiments, the depth of the recess 112R is about 50 Angstroms to about 2000 Angstroms. In some embodiments, the hard mask layer 160 has a higher etch resistance to an etchant used in the etching process than that of the oxidized surface layer, thereby protecting underlying layers in the peripheral region 114 from being etched. In some embodiments, the portion of the isolation feature 146 not covered by the hard mask layer 160 may be further etched in this process. For example, a top surface 146TB of the portion of the isolation feature 146 not covered by the hard mask layer 160 may be higher than the top surface 112S of the cell region 112 but lower than a top surface 146TA of a portion of the isolation feature 146 covered by the hard mask layer 160. That is, the top surface 146T of the isolation feature 146 has a step.

Referring to FIG. 1A and FIG. 8, where the cross-sectional position of FIG. 8 is the same as the cross-sectional position of FIG. 7. The method M proceeds to step S7 where a tunneling film is formed over the cell region of the substrate. In the present embodiments, a tunneling film 180 is then conformally formed over the substrate 110. In some embodiments, the tunneling film 180 may include, for example, a dielectric material such as silicon dioxide ($SiO_2$), silicon nitride ($Si_3N_4$), oxynitrides (SiON), high-k materials, other non-conductive materials, or combinations thereof. The tunneling film 180 may be formed using thermal oxidation, chemical vapor deposition (CVD), physical vapor deposition (PVD), atomic layer deposition (ALD), ozone oxidation, other suitable processes, or combinations thereof. The thermal oxidation may result in the tunneling film 180 with a uniform thickness over the cell region 112. In some embodiments, the formation of the tunneling film 180 may also form a dielectric layer 188 over the hard mask layer 160. In some embodiments, the dielectric layer 188 and the tunneling film 180 have the same material.

Referring to FIG. 1A and FIG. 9, where the cross-sectional position of FIG. 9 is the same as the cross-sectional position of FIG. 8. The method M proceeds to step S8 where a floating gate film, a pad layer, and a hard mask layer are formed over the substrate. In the present embodiments, a floating gate film 190 is conformally formed over the structure in FIG. 8 (i.e., over the tunneling film 180, the isolation feature 146, and the dielectric layer 188). The floating gate film 190 may include polysilicon formed through, for example, low pressure CVD (LPCVD) methods, CVD methods and PVD sputtering methods employing suitable silicon source materials. The floating gate film may be deposited with desired thickness for floating gates. For example, a thickness of the floating gate film 190 is in a range of about 50 angstroms to about 150 angstroms. If the thickness of the floating gate film 190 is greater than about 150 angstroms, thick floating gates would be formed, and control gates later formed over the floating gates would have a higher top surface, which makes it difficult to integrate the fabrication process of the memory devices into a high-k metal gate (HKMG) process of logic devices. If the thickness of the floating gate film 190 is less than about 50 angstroms, the formed memory devices may have poor storage ability. If desired, the floating gate film 190 may be ion implanted to the desired conductive type. For example, the floating gate film 190 may be in-situ doped. The floating gate film 190 may include other gate electrode material such as metal, metal alloys, single crystalline silicon, or combinations thereof.

After the formation of the floating gate film 190, another pad layer 200 is conformally formed over the floating gate film 190, and another hard mask layer 210 is conformally formed over the pad layer 200. The pad layer 200 may be formed of dielectric material, such as an oxide layer. The pad layer 200 may serve as a buffer layer between the floating gate film 190 and the hard mask layer 210. The hard mask layer 210 can be formed of dielectric material, such as silicon nitride (SiN) or other suitable materials.

Figure 10A:
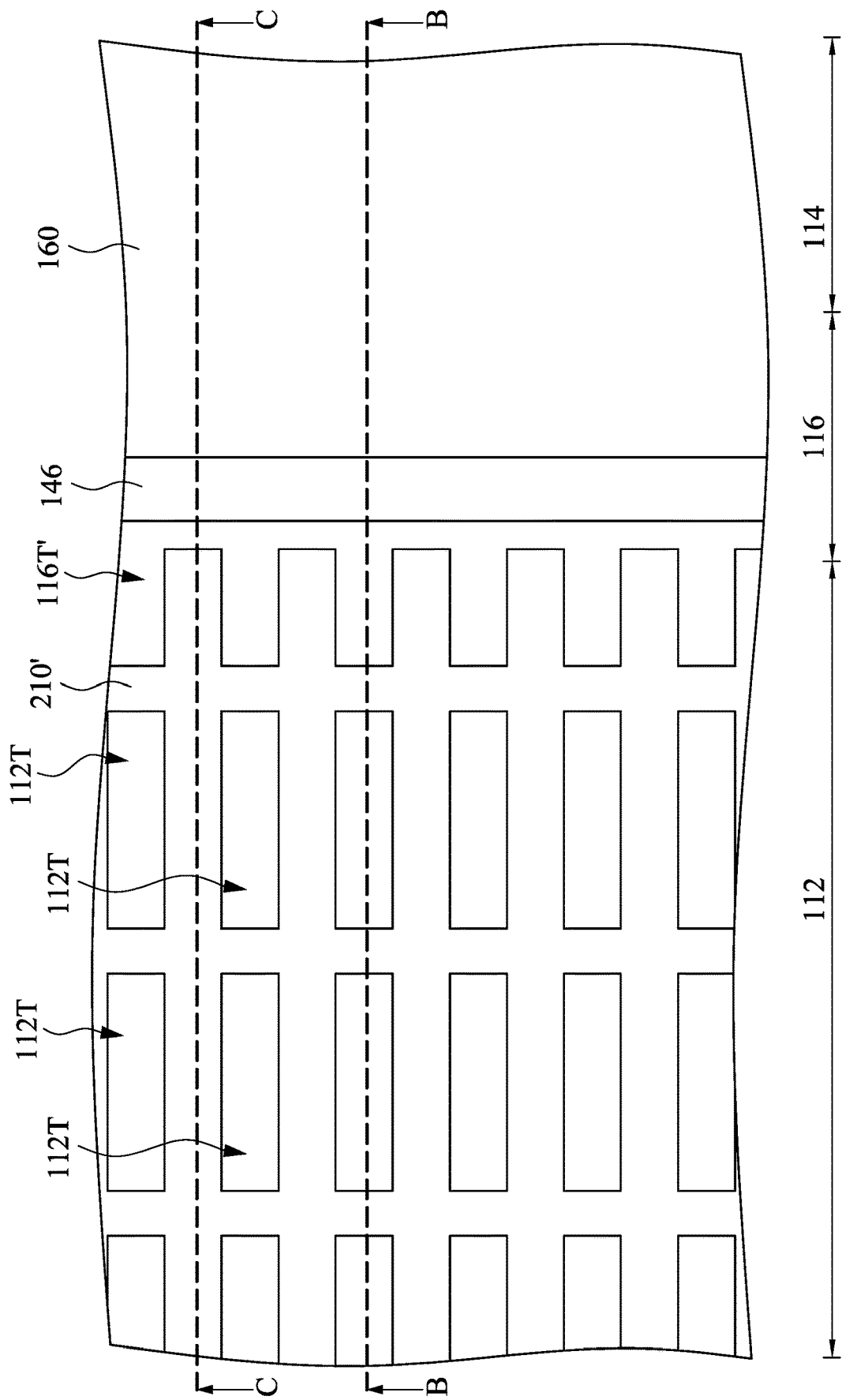
Figure 10B:
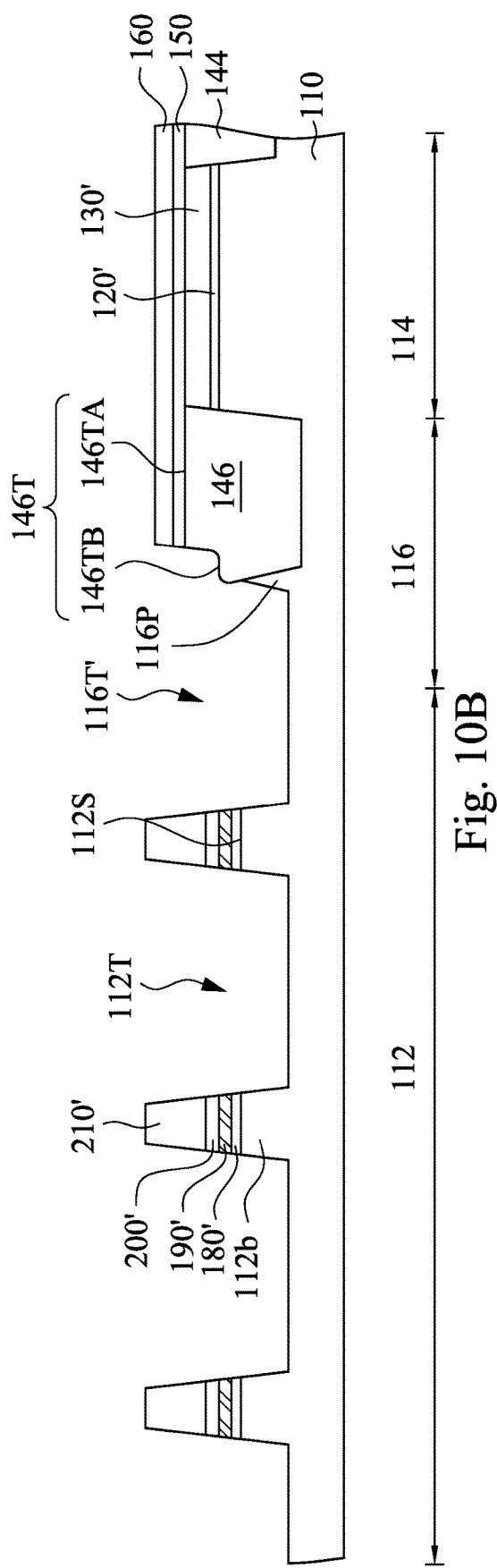
Figure 10C:
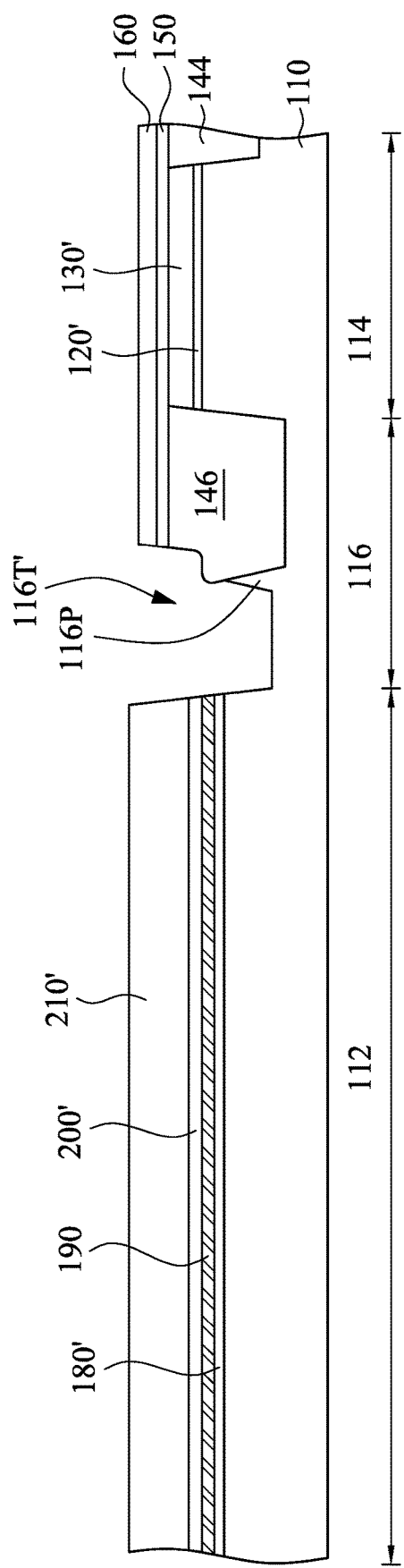

Referring to FIG. 1A and FIGS. 10A to 10C, where FIG. 10A is a top view of the semiconductor device, FIG. 10B is a cross-sectional view taking along line B-B of FIG. 10A, and FIG. 10C is a cross-sectional view taking along line C-C of FIG. 10A. The method M proceeds to step S9 where the substrate is patterned to form plural trenches in the cell region. In the present embodiments, the hard mask layer 210, the pad layer 200, the floating gate film 190, the tunneling film 180, and the substrate 110 of FIG. 9 are patterned, so as to form trenches 112T in the cell region 112 and a trench 116T' in the transition region 116. In some embodiments, a width of the trench 116T' taking along line B-B of FIG. 10A may be greater than a width of the trench 116T' taking along line C-C of FIG. 10A. In the present embodiments, the trenches 116T' exposes an upper part of a sidewall of the isolation features 146 and a part of the surface 146TB of the isolation features 146 uncovered by the hard mask layer 160. A lower part of the sidewall of the isolation features 146 may be covered by a protrusion portion 116p of the substrate 110. In some embodiments, the protrusion portion 116p has a tapered shape. For example, the protrusion portion 116p tapered upward. A peak of the protrusion portion 116p is lower than the top surface 146TB and 146TA of the isolation feature 146. In some embodiments, the peak of the protrusion portion 116p is substantially leveled with the top surface 112S of the cell region 112 of the substrate 110.

For example, a photoresist layer is formed on the hard mask layer 210 (referring to FIG. 9) and then patterned by photolithography processes, forming openings in the photoresist layer, such that regions of the hard mask layer 210 (referring to FIG. 9) are exposed by the photoresist layer. The hard mask layer 210 is patterned by etching the exposed portions of the hard mask layer 210 (referring to FIG. 9). After the patterning process, the patterned hard mask layer 210' covers portions of the pad layer 200 (referring to FIG. 9) and exposes portions of the pad layer 200 (referring to FIG. 9).

The exposed portions of the pad layer 200, the floating gate film 190, the underlying tunneling layer 180, and the substrate 110 are then etched using the patterned hard mask layer 210' as etch mask by plural dry etching processes, such as reactive-ion etching (RIE). The dry etching processes may use various gas etchants. For example, gas etchants like HBr, $Cl_2$, $CF_4$, and/or $CHF_3$ may be used during the dry etching processes. The patterned hard mask layer 210' may have a higher etch resistance to the etchants than that of the pad layer 200, the floating gate film 190, the tunneling film 180, and the substrate 110 (referring to FIG. 9), thereby protecting underlying layers in the cell region 112 from being etched. The dielectric layer 188 may be removed by the dry etching processes. The hard mask layer 160 may have a higher etch resistance to the etchants than that of the dielectric layer 188, the floating gate film 190, the tunneling film 180, and the substrate 110 (referring to FIG. 9), thereby protecting underlying layers in the peripheral region 114 from being etched. Through the etching processes, trenches 112T and 116T' are formed.

In the present embodiments, the hard mask layer 210 of FIG. 9 is patterned to be a patterned hard mask layer 210', the pad layer 200 of FIG. 9 is patterned to be a patterned pad layer 200', the floating gate film 190 of FIG. 9 is patterned to be a patterned floating gate film 190', the tunneling film 180 of FIG. 9 is patterned to be a patterned tunneling film 180', and the substrate 110 is patterned to include plural base portions 112b in the cell region 112 of the substrate 110. The base portions 112b are separated from each other by the trench(es) 112T. The tunneling film 180' is disposed over the substrate 110, the floating gate film 190' is disposed over the tunneling film 180', the patterned pad layer 200' is disposed over the floating gate film 190', and the hard mask layer 210' is disposed over the patterned pad layer 200'. Through the etching processes, portions of the hard mask layer 210', the pad layer 200', the floating gate film 190', and the tunneling film 180' of FIG. 9 over the peripheral region 114 are removed.

Figure 11A:
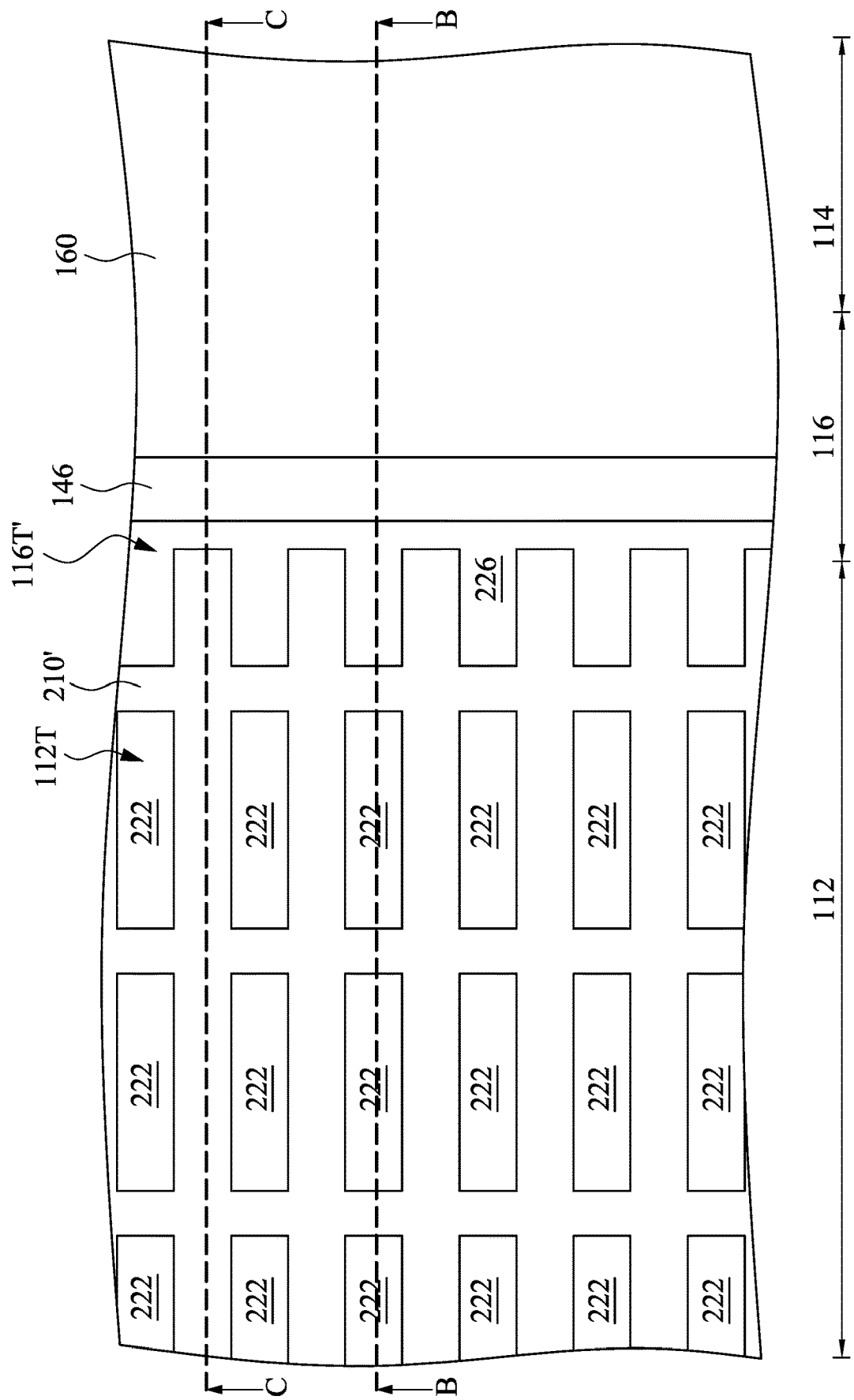

Referring to FIG. 1B and FIGS. 11A to 11C, where FIG. 11A is a top view of the semiconductor device, FIG. 11B is a cross-sectional view taking along line B-B of FIG. 11A, and FIG. 11C is a cross-sectional view taking along line C-C of FIG. 11A. The method M proceeds to step S10 where isolation features are formed in the trenches in the cell region. In the present embodiments, isolation features 222 and 226 are formed in the trenches 112T and 116T', respectively. The isolation features 222 defines plural active regions 112a (e.g., portions of the base portions 112b) in the cell region 112. The isolation feature 226 isolates active regions 112a in the cell region 112 from the active regions 114a in the peripheral region 114. According to the profile of the trench 116T', a width of the isolation feature 226 taking along line B-B of FIG. 11A may be greater than a width of the isolation feature 226 taking along line C-C of FIG. 11A. In the present embodiments, the substrate 110 includes a protruding portion 116p between the isolation features 146 and 226 in the transition region 116. The protruding portion 116p tapers upward. In some embodiments, the isolation features 222 and 226 are made of silicon oxide, silicon nitride, silicon oxynitride, fluoride-doped silicate glass (FSG), or other low-K dielectric materials.

In some embodiments, a dielectric material may be formed over the structure of FIGS. 10B and 10C by suitable process, such as a high-density-plasma (HDP) chemical vapor deposition (CVD) process, a sub-atmospheric CVD (SACVD) process, a high aspect-ratio process (HARP), a spin-on-dielectric (SOD) process or other suitable process. The dielectric material may overfill the trenches 112T and 116T'. In some embodiments, a liner oxide (not shown) may be formed optionally in advance. In some embodiments, the liner oxide may be a thermal oxide. A chemical mechanical polish (CMP) process is then performed to remove the excess dielectric material outside the trenches 112T and 116T', and the CMP process may level the top surface of the dielectric material to the top surfaces of the patterned hard mask layer 160, thereby forming the isolation features 222 and 226. In some embodiments, the dielectric layer 188 (e.g., oxide layer) over the hard mask layer 160 is removed by the CMP process.

The isolation features 222 may be in contact with the base portions 112b of the substrate 110, the patterned tunneling film 180', the patterned floating gate film 190', the patterned pad layer 200', and the patterned mask layer 210'. In the present embodiments, the isolation feature 226 is in contact with an upper part of the sidewall of the isolation features 146 and a part of the surface of the isolation features 146 uncovered by the hard mask layer 160.

In the present embodiments, a bottom of the trench 116T' is higher than a bottom of the trench 116T, such that a bottom surface 226B of the isolation feature 226 is higher than a bottom surface 146B of the isolation feature 146. In some other embodiments, the bottom surface 226B of the isolation feature 226 may not be higher than the bottom surface 146B of the isolation feature 146 in some embodiments. For example, the bottom of the trench 116T' may be lower than the bottom of the trench 116T, such that the bottom surface 226B of the isolation feature 226 is lower than the bottom surface 146B of the isolation feature 146. Alternatively, in some other embodiments, the bottom of the trench 116T' may be substantially level with the bottom of the trench 116T, such that the bottom surface 226B of the isolation feature 226 is substantially level with the bottom surface 146B of the isolation feature 146.

Referring to FIG. 1B and FIGS. 12A to 12B, where the cross-sectional positions of FIGS. 12A to 12B are the same as the cross-sectional position of FIGS. 11B to 11C. The method M proceeds to step S10 where isolation features in the cell region are recessed. In the present embodiments, the isolation features 222 and 226 are recessed by a wet etch process. For example, liquid etchants, such as HF, are dispensed onto the structure of FIGS. 11A-11C, thereby etching the isolation features 222 and 226. The patterned hard mask layer 210' and the patterned hard mask layer 160 have a higher etch resistance to the etchant than that of the isolation features 222 and 226, such that the isolation features 144 and 146 under the hard mask layers 160 are prevented from being etched, and the layers 180' to 200' under the masks 210' are prevented from being etched. In some other embodiments, a portion of the isolation feature 146 uncovered by the hard mask layers 160 may be etched by the wet etch process.

Figure 13A:
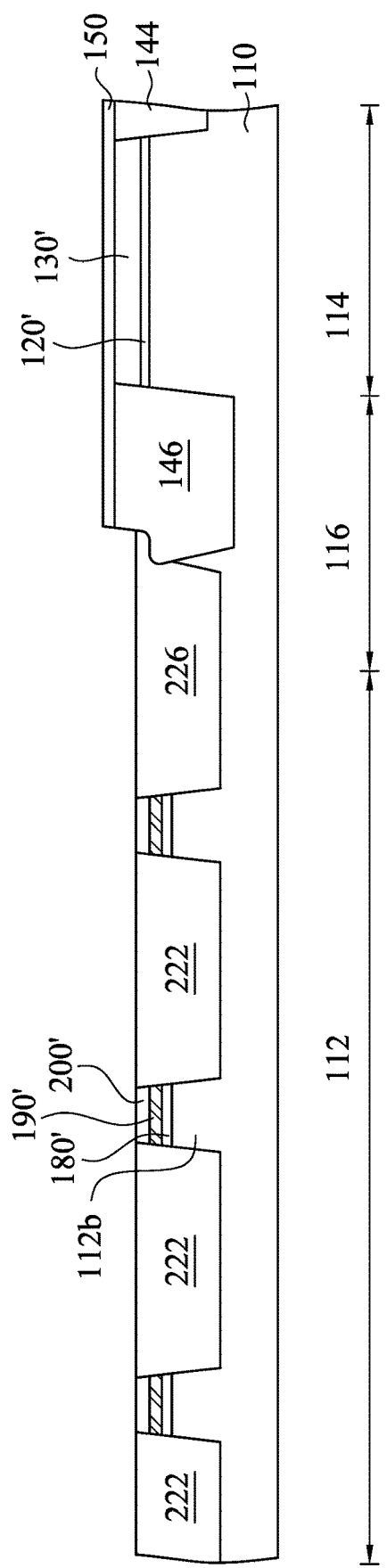
Figure 13B:
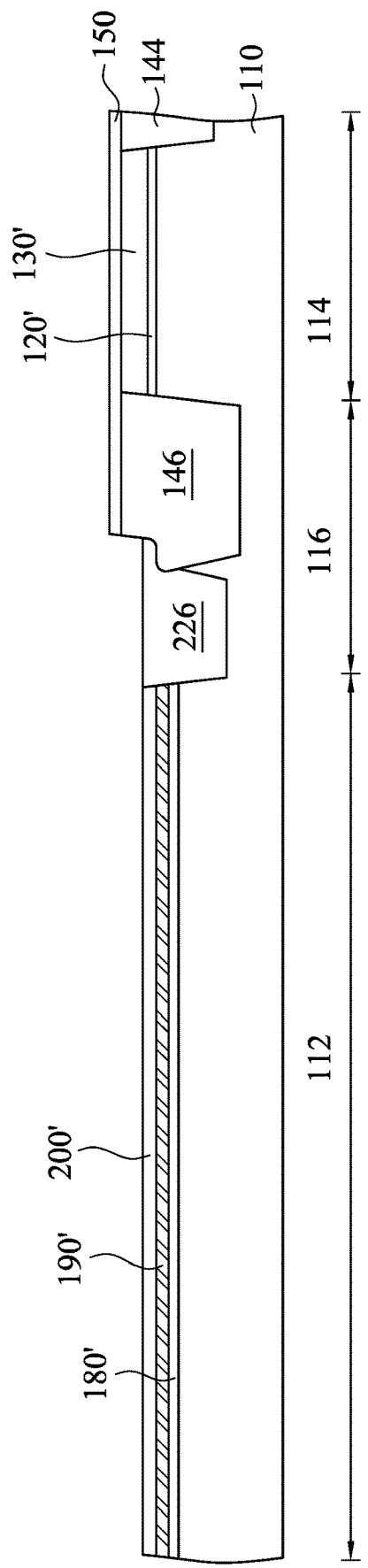

Referring to FIG. 1B and FIGS. 13A to 13B, where the cross-sectional positions of FIGS. 13A to 13B are the same as the cross-sectional position of FIGS. 12A to 12B. The method M proceeds to step S12 where the hard mask layers are removed. In the present embodiments, the patterned hard mask layer 210' and the patterned hard mask layer 160 are removed, and the pad layers 200' and 150 are exposed. The removal method may include suitable etching back process, for example, using phosphoric acid as etchant. The pad layers 200' and 150 may have a higher etch resistance to the etching process than that of the patterned mask layers 210' and 160, such that the pad layers 200' and 150 may protect the underlying layers from being etched in the etching process. In some embodiments, the isolation features 222 and 226 may have a higher etch resistance to the etching process than that of the patterned mask layers 210' and 160, such that the isolation features 222 and 226 remains intact after the etching process.

Figure 14A:
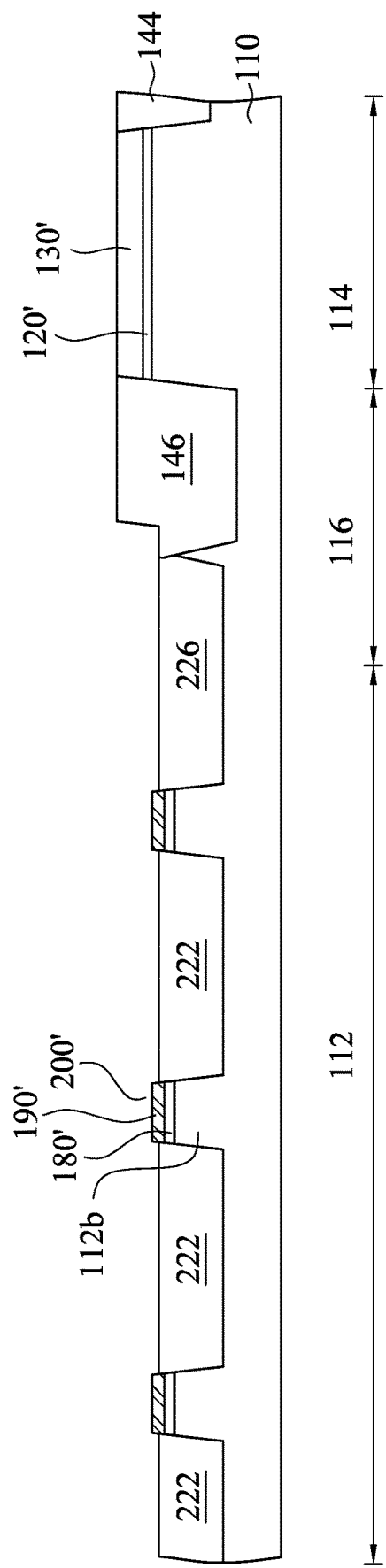
Figure 14B:
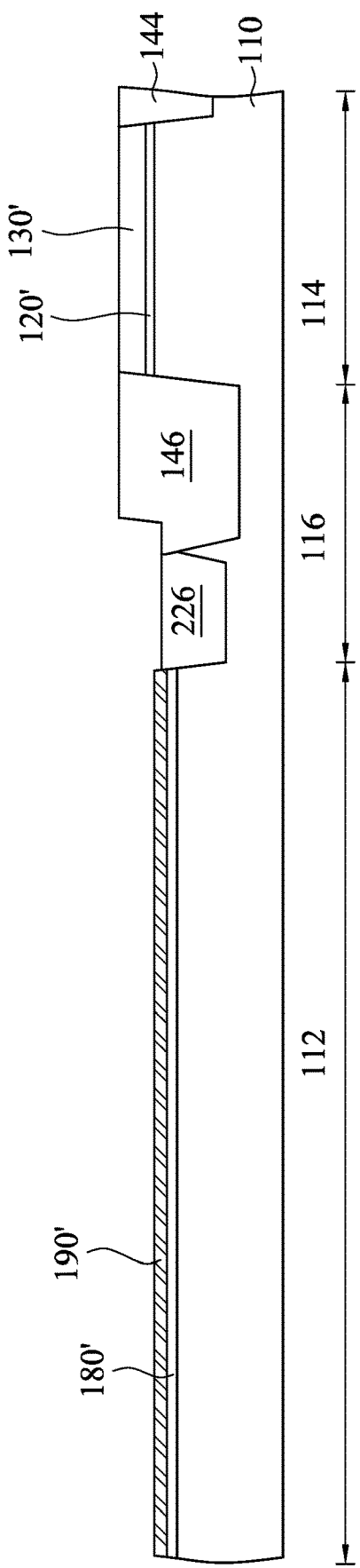

Referring to FIG. 1B and FIGS. 14A to 14B, where the cross-sectional positions of FIGS. 14A to 14B are the same as the cross-sectional position of FIGS. 13A to 13B. The method M proceeds to step S13 where the isolation features are recessed. In the present embodiments, the isolation features 222 and 226 are recessed by a wet etch process. For example, liquid etchants, such as HF, are dispensed onto the structure of FIGS. 13A and 13B, thereby etching the isolation features 222 and 226. The pad layers 200' and 150 (referring to FIGS. 13A to 13B) may be removed by the wet etching process. The hard mask layer 130' and the floating gate film 190' may have a higher etch resistance to the etchant than that of the isolation features 222 and 226 and the pad layers 200' and 150 (referring to FIGS. 13A to 13B), such that the tunneling film 180' under the a floating gate film 190' is prevented from being etched, and the pad layer 120' under the hard mask layer 130' is prevented from being etched. In some embodiments, a portion of the isolation feature 226 adjacent to the isolation feature 146 is etched by the wet etch process. After the recessing, the floating gate film 190' protrudes from a top surface of the isolation features 222 and 226. Recessing the isolation features 222 and 226 may enhance a coupling ratio between floating gates and control gates that are subsequently formed.

Referring to FIG. 1B and FIGS. 15A and 15B, where the cross-sectional positions of FIGS. 15A and 15B are respectively the same as the cross-sectional position of FIGS. 14A to 14B. The method M proceeds to step S14 where a dielectric film, a control gate film, and a hard mask layer are formed over the substrate. In the present embodiments, a dielectric film 310 is conformally formed over the structure of FIGS. 14A to 14B. In some embodiments, the dielectric film 310 and the tunneling film 180' may have the same or different materials. That is, the dielectric film 310 may include, for example, a dielectric material such as silicon dioxide ($SiO_2$), silicon nitride ($Si_3N_4$), oxynitrides (SiON), high-k materials, other non-conductive materials, or combinations thereof. The dielectric film 310 may be formed using chemical vapor deposition (CVD), physical vapor deposition (PVD), atomic layer deposition (ALD), ozone oxidation, other suitable processes, or combinations thereof.

A control gate film 320 is conformally formed over the dielectric film 310. The control gate film 320 may include polysilicon formed through, for example low pressure CVD (LPCVD) methods, CVD methods and PVD sputtering methods employing suitable silicon source materials. If desired, the control gate film 320 may be ion implanted to the desired conductive type. It is to be appreciated that the control gate film 320 may include other gate electrode material such as metal, metal alloys, single crystalline silicon, or combinations thereof.

A hard mask layer 330 is conformally formed over the control gate film 320. The hard mask layer 330 may include single layer or multiple layers. In some embodiments, the hard mask layer 330 includes $SiN/SiO_2/SiN$ stacked layers or other suitable materials. In some embodiments, the hard mask layer 330 may be formed using chemical vapor deposition (CVD), physical vapor deposition (PVD), atomic layer deposition (ALD), ozone oxidation, other suitable processes, or combinations thereof.

Figure 16A:
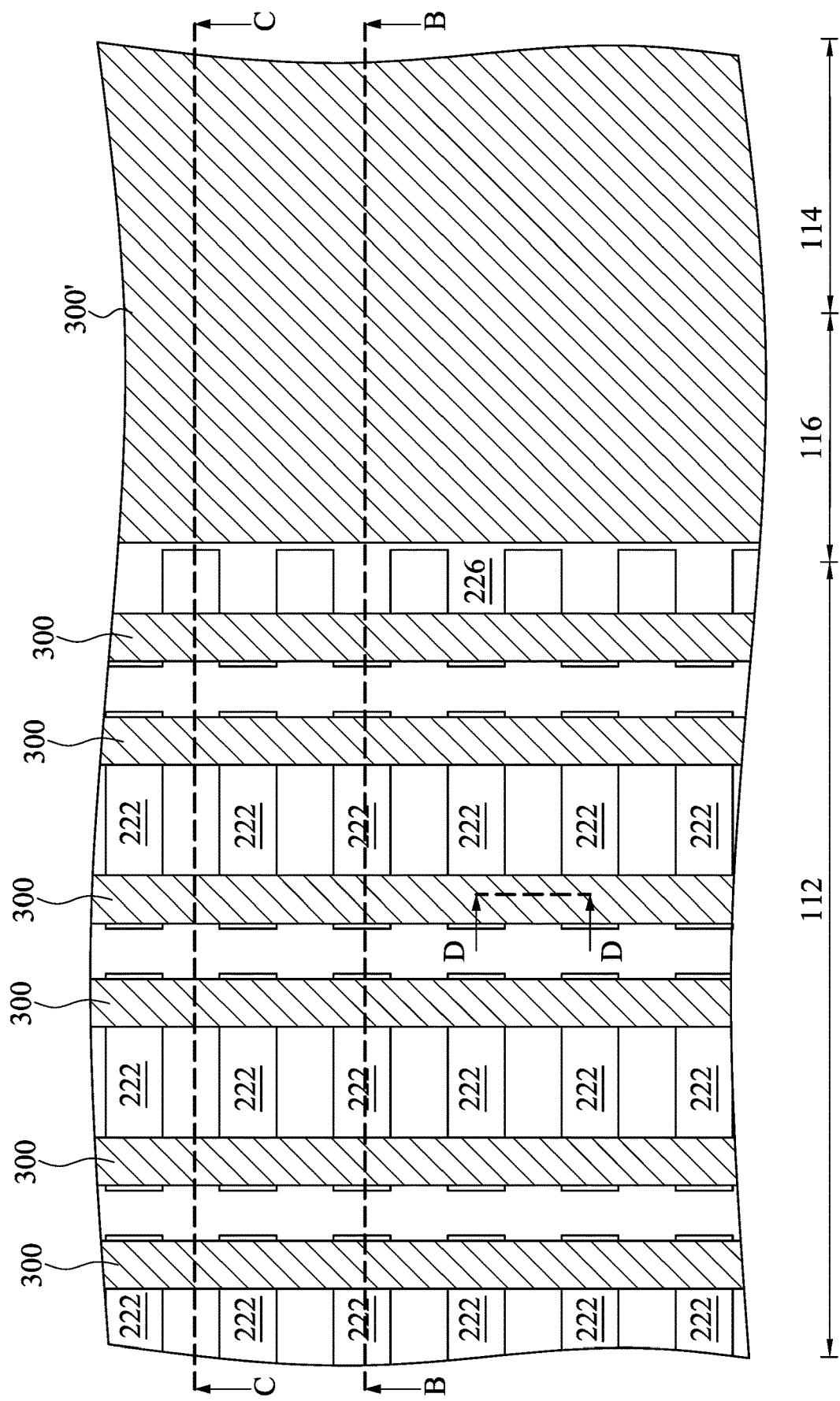
Figure 16B:
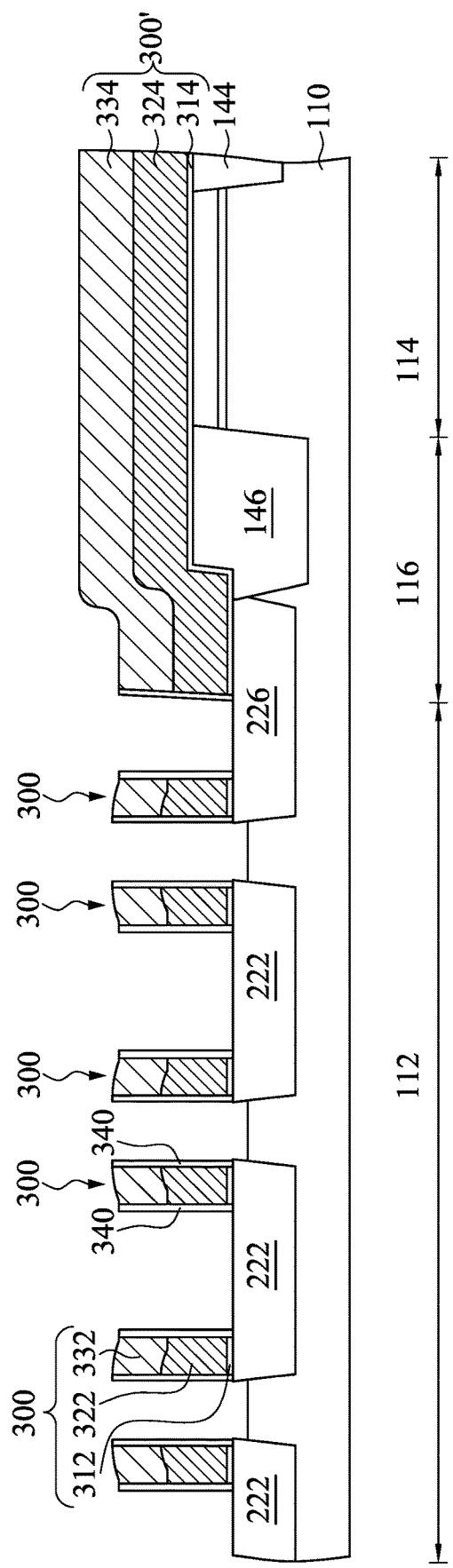
Figure 16C:
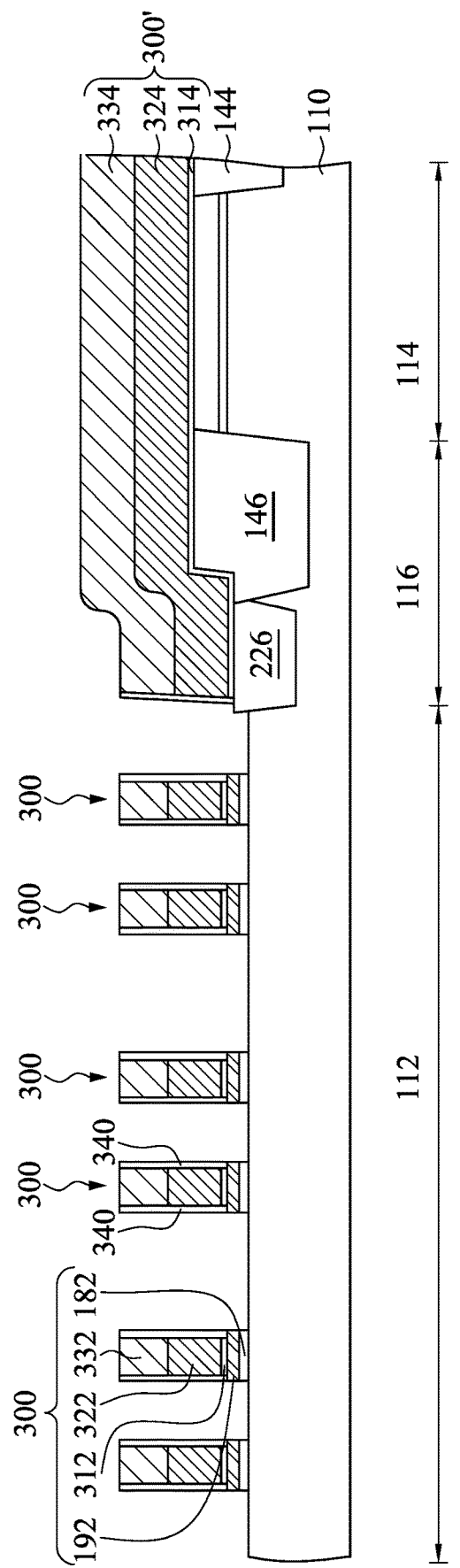
Figure 16D:
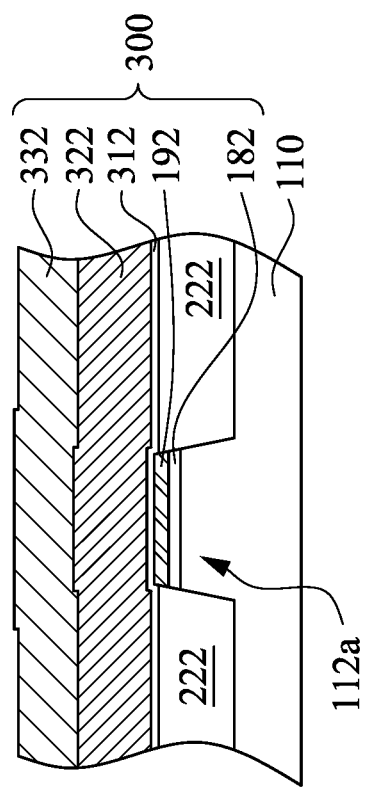

Referring to FIG. 1B and FIGS. 16A to 16D, where FIG. 16A is a top view of the semiconductor device, FIG. 16B is a cross-sectional view taking along line B-B of FIG. 16A, FIG. 16C is a cross-sectional view taking along line C-C of FIG. 16A, and FIG. 16D is a cross-sectional view taking along line D-D of FIG. 16A. The method M proceeds to step S15 where the dielectric film, the control gate film, and the hard mask layer are patterned to form gate stacks over the cell region of the substrate. In the present embodiments, the hard mask layer 330, the control gate film 320, the dielectric film 310, the floating gate film 190', and the tunneling film 180' of FIGS. 15A and 15B are patterned to form plural gate stacks 300 over the cell region 112 of the substrate 110 and a semiconductor stack 300' over the peripheral region 114 and the transition region 116. The hard mask layer 330 of FIGS. 15A and 15B can be patterned to form hard masks 332 and a hard mask layer 334. The control gate film 320 of FIGS. 15A and 15B can be patterned to form control gates 322 and a control gate layer 324. The dielectric film 310 of FIGS. 15A and 15B can be patterned to form dielectric layers 312 and a dielectric layer 314. The floating gate film 190' of FIGS. 15A and 15B can be patterned to form floating gates 192. In some embodiments, the floating gate 192 may be thinner than the control gate 322. The tunneling film 180' of FIGS. 15A and 15B can be patterned to form tunneling layers 182.

In some embodiments, at least one of the gate stacks 300 includes a tunneling layer 182, a floating gate 192, a dielectric layer 312, a control gate 322, and a hard mask 332. At least one of the gate stacks 300 may further include a pair of spacers 340 disposed over the floating gate 192 and on opposite sides of the dielectric layer 312, the control gate 322, and the hard mask 332. For clarity, the spacers 340 are illustrated in FIGS. 16B and 16C and are omitted in FIG. 16A. In some embodiments, the spacer 340 includes an inner silicon oxide layer, a middle silicon nitride layer, and an outer silicon oxide layer. The semiconductor stack 300' may include the dielectric layer 314, the control gate layer 324 over the dielectric layer 314, and the hard mask layer 334 over the control gate layer 324.

Figure 17A:
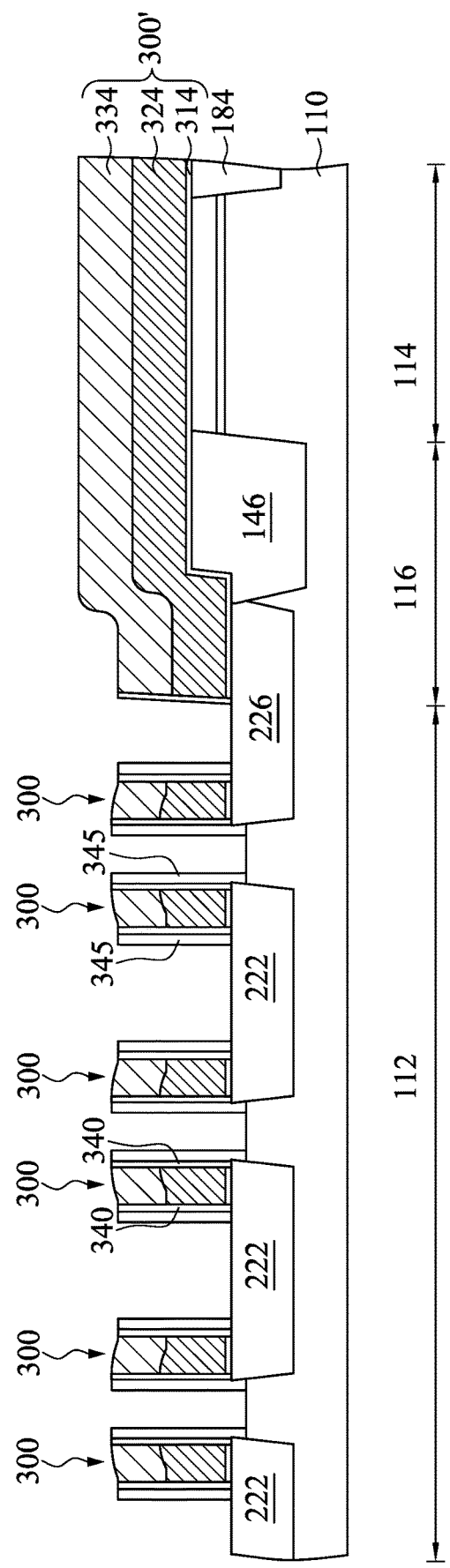
Figure 17B:
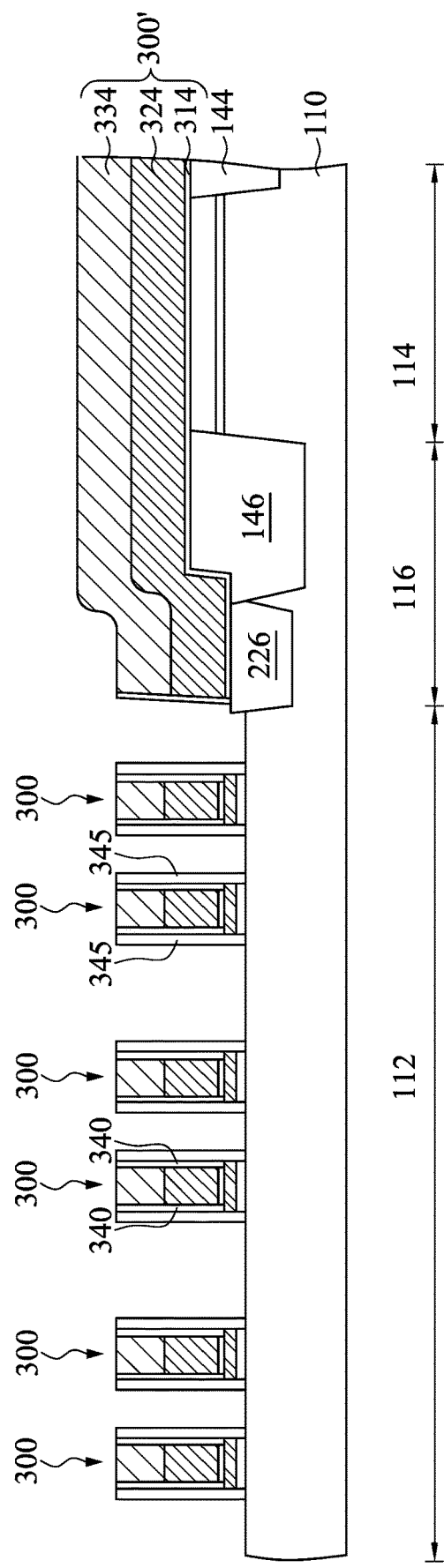

Referring to FIG. 1B and FIGS. 17A and 17B, where the cross-sectional positions of FIGS. 17A and 17B are respectively the same as the cross-sectional position of FIGS. 16B and 16C. The method M proceeds to step S16 where spacers are formed on opposite sides of the gate stacks. In the present embodiments, spacers 345 are formed on opposite sides of the gate stacks 300. In some embodiments, the spacers 345 are high temperature oxide layer or other suitable dielectric layers. In some embodiments, a dielectric film may be conformally formed over the structure of FIGS. 16A to 16C, and an etching process (e.g., dry etch process) is performed to remove the horizontal portions of the dielectric film to form the spacers 345.

Referring to FIG. 1B and FIGS. 18A and 18B, where the cross-sectional positions of FIGS. 18A and 18B are respectively the same as the cross-sectional position of FIGS. 17A and 17B. The method M proceeds to step S17 where source regions are formed between two adjacent gate stacks. In the present embodiments, the spacers 345 between adjacent two gate stacks 300 are removed, and source regions SR are formed between two adjacent gate stacks 300. For example, a patterned photoresist layer is formed by a combination of spin coating, exposing and developing processes to expose areas of the substrate 110 between adjacent gate stacks 300. The exposed spacers 345 are then removed, and ions are implanted into the areas to form the source regions SR. A common source (CS) dielectric layer SRD is formed over the source region SR. The CS dielectric layer SRD may be a dielectric isolation structure and may be formed by oxidizing the substrate 110, other suitable processes, or combinations thereof. The patterned photoresist layer is then removed, and the removal method may be performed by solvent stripping or plasma ashing, for example.

Figure 19A:
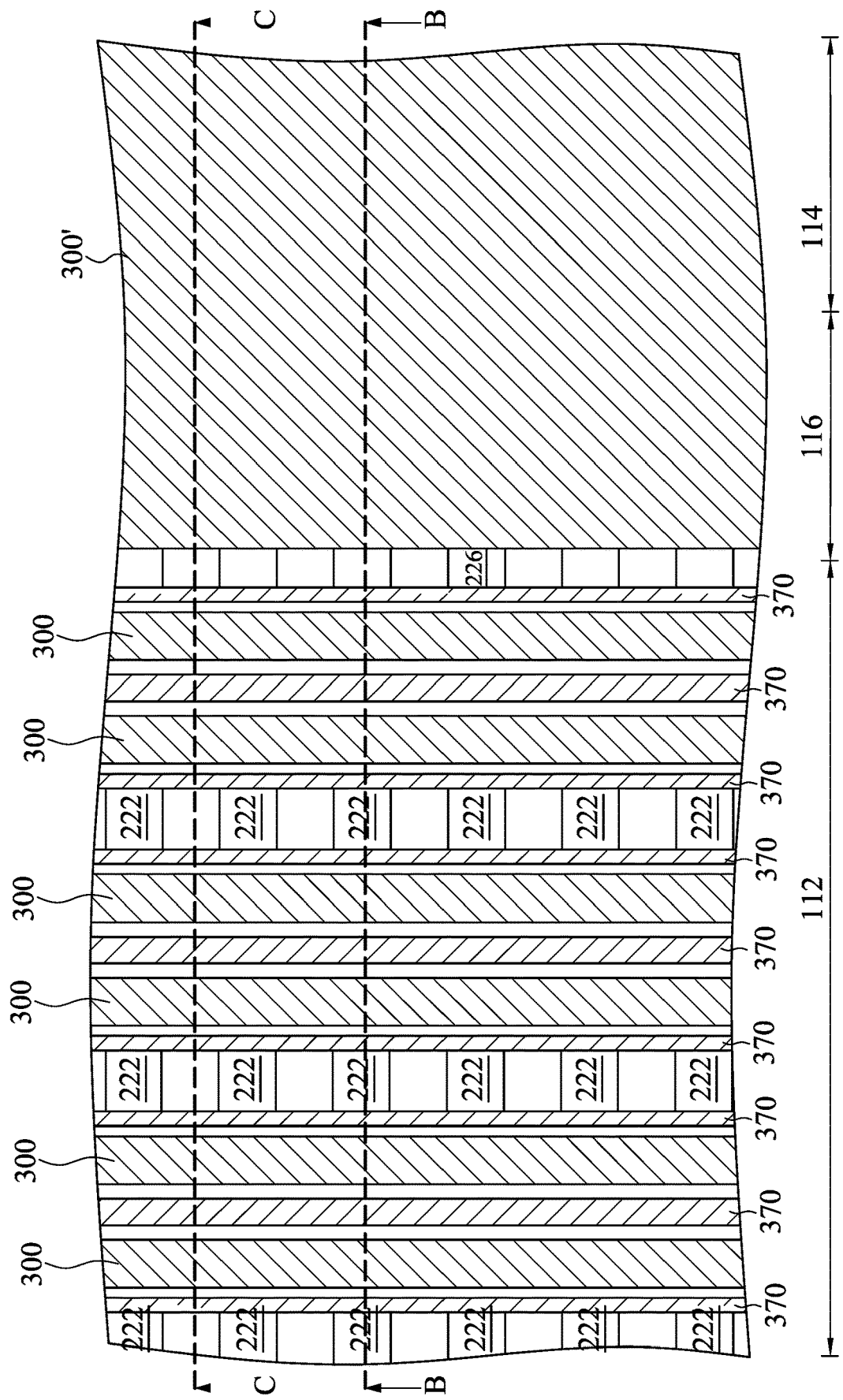
Figure 19B:
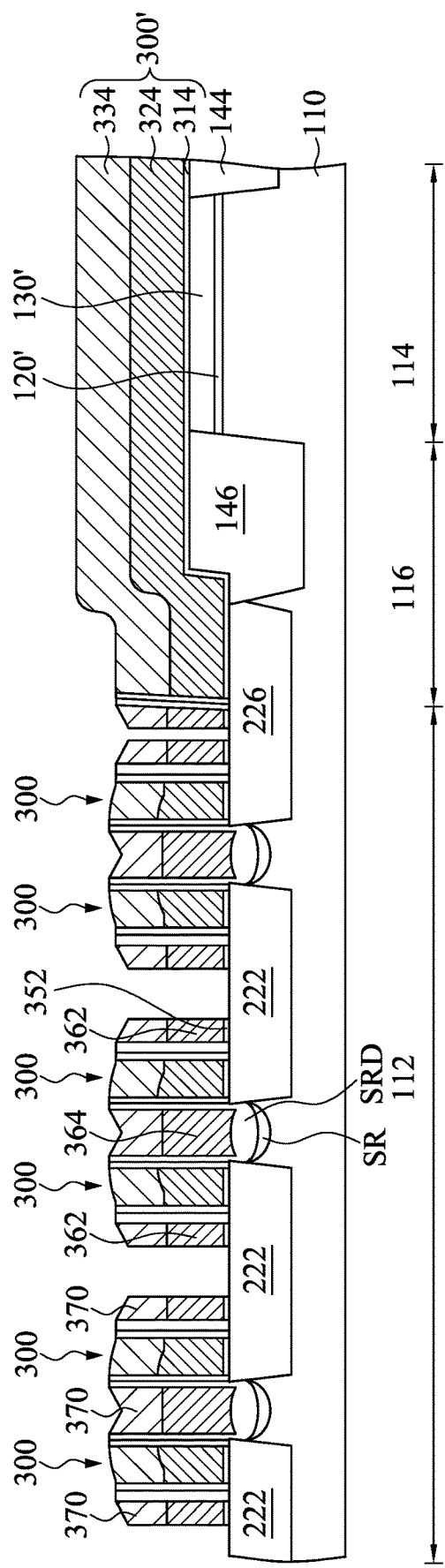
Figure 19C:
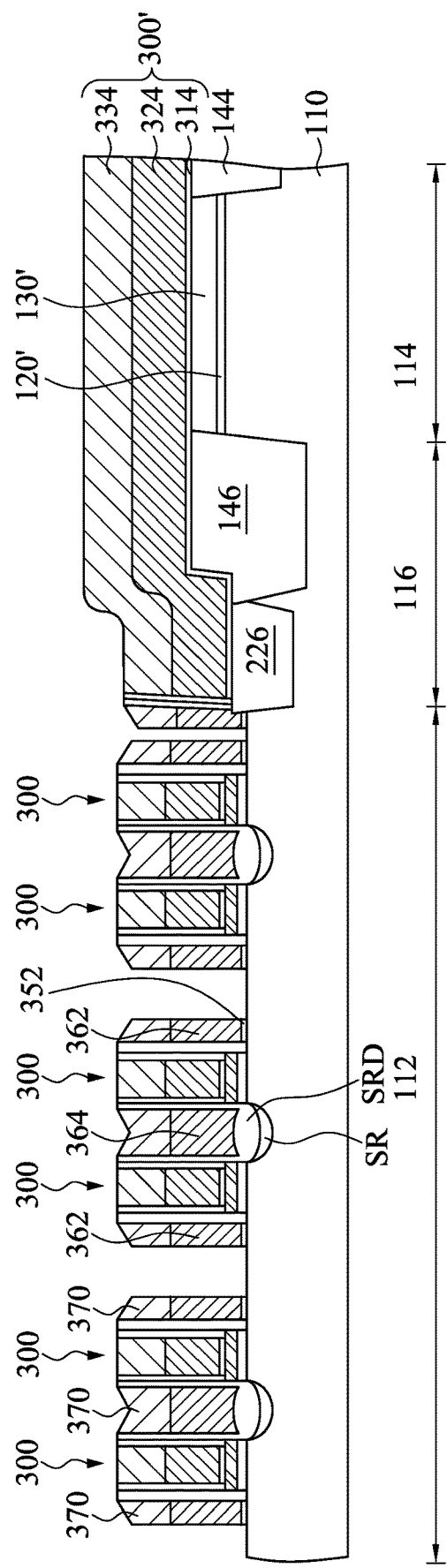

Referring to FIG. 1B and FIGS. 19A to 19C, where FIG. 19A is a top view of the semiconductor device, FIG. 19B is a cross-sectional view taking along line B-B of FIG. 19A, and FIG. 19C is a cross-sectional view taking along line C-C of FIG. 19A. The method M proceeds to step S18 where erase gates and select gates are formed on opposite sides of the gate stacks. In the present embodiments, plural select gate dielectric layers 352 and plural select gates (or word lines) 362 are formed on first sides of the gate stacks 300, and plural erase gates 364 are formed on second sides of the gate stacks 300. For example, a dielectric layer is formed over the substrate 110, for example, by a thermal oxidation process, chemical vapor deposition, or atomic layer deposition, a conductive layer is deposited over the dielectric layer, and then the conductive layer is patterned or etched back. Then, plural hard masks 370 are respectively formed over the patterned conductive layer, and another etching process is formed to pattern the patterned conductive layer and the dielectric layer using the hard masks 370 as masks to form the erase gates 364, the select gates 362, and the select gate dielectric layers 352. In some embodiments, the erase gates 364 and the select gates 362 may be made of polysilicon or other suitable materials. If desired, the erase gates 364 and the select gates 362 may be ion implanted to the desired conductive type. For example, the erase gates 364 and the select gates 362 may be in-situ doped. In some embodiments, the select gate dielectric layers 352 may include silicon oxide, silicon nitride, silicon oxynitride, other non-conductive materials, or the combinations thereof.

Referring to FIG. 1B and FIGS. 20A and 20B, where the cross-sectional positions of FIGS. 20A and 20B are respectively the same as the cross-sectional position of FIGS. 19B and 19C. The method M proceeds to step S19 where semiconductor devices are formed in the peripheral and transition regions. In the present embodiments, the semiconductor stack 300' of FIGS. 19B and 19C are removed to expose the patterned mask layers 130' (see FIGS. 19B and 19C) and the isolation feature 144. A portion of the semiconductor stack 300' (which is referred to as the semiconductor stack 300" hereinafter) remains over the isolation feature 226 after the removing process. The patterned pad layer 120' and the patterned hard mask layer 130' (see FIGS. 19A and 19B) are then removed to expose the substrate 110 in the peripheral region 114. Then, the isolation features 146 and 144 are recessed until the top surfaces of the isolation features 146 and 184 are substantially flush with the substrate 110 in the peripheral region 114. At least one semiconductor device 400 is formed over the substrate 110 in the peripheral region 114 and at least one dummy semiconductor device 400' is formed over the isolation feature 146. In some embodiments, the semiconductor device 400 can be a transistor (such as a high-K metal gate (HKMG) transistor, and/or a logic transistor), and the present disclosure is not limited in this respect. In some embodiments, the dummy semiconductor device 400' and the semiconductor device 400 are made of the same materials.

In some embodiments, one or more ion implantation processes are performed to the substrate 110, thereby forming drain regions DR in the cell region 112 and source/drain regions 400SD in the peripheral region 114. The drain regions DR and the source/drain regions 400SD may be formed be the same or different ion implantation processes. In some embodiments, the gate stack 300 and the select gate 362 are disposed in a position between the source region SR and the drain region DR, and drain regions DR are respectively disposed adjacent to the select gates 362.

Figure 21A:
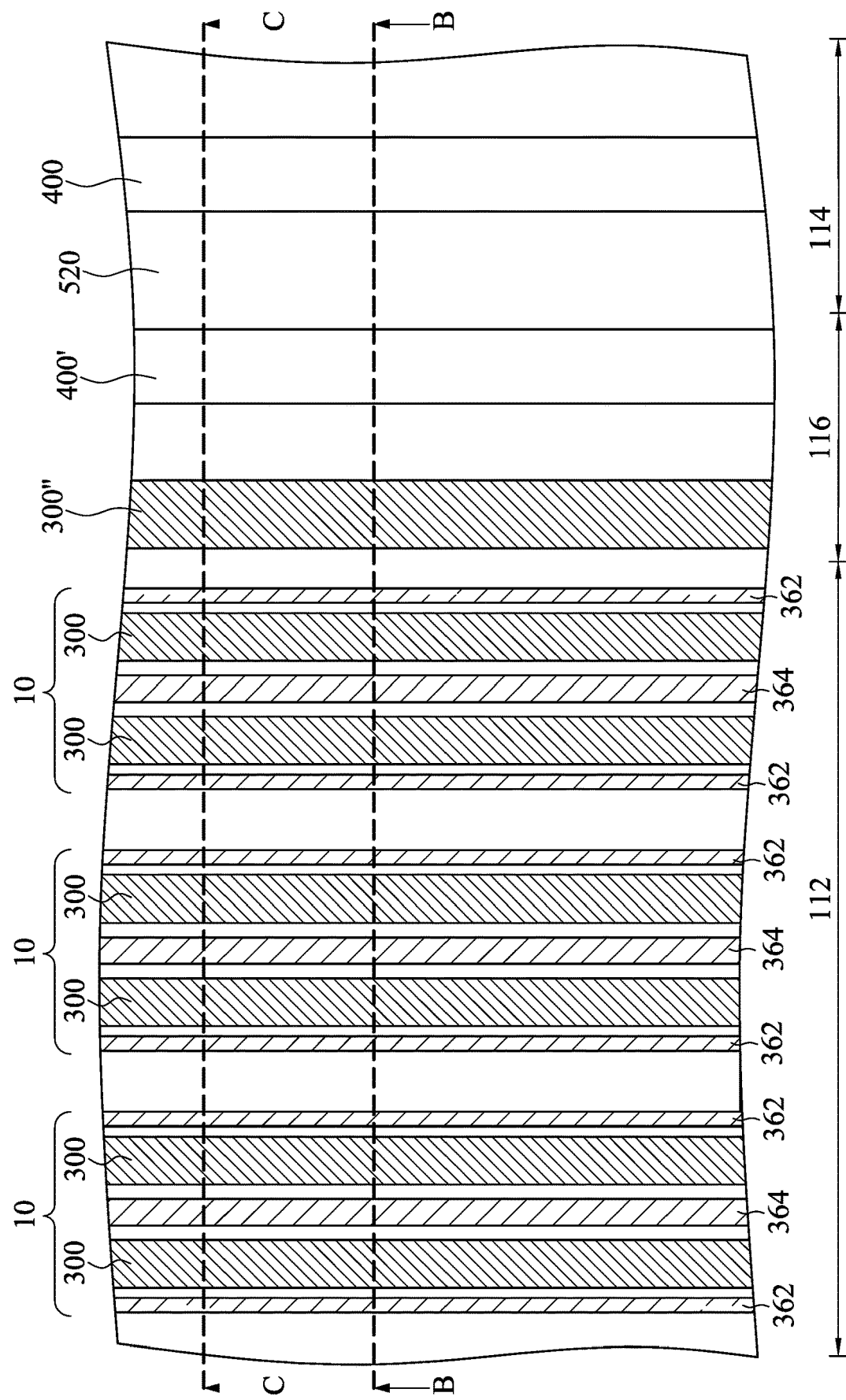
Figure 21B:
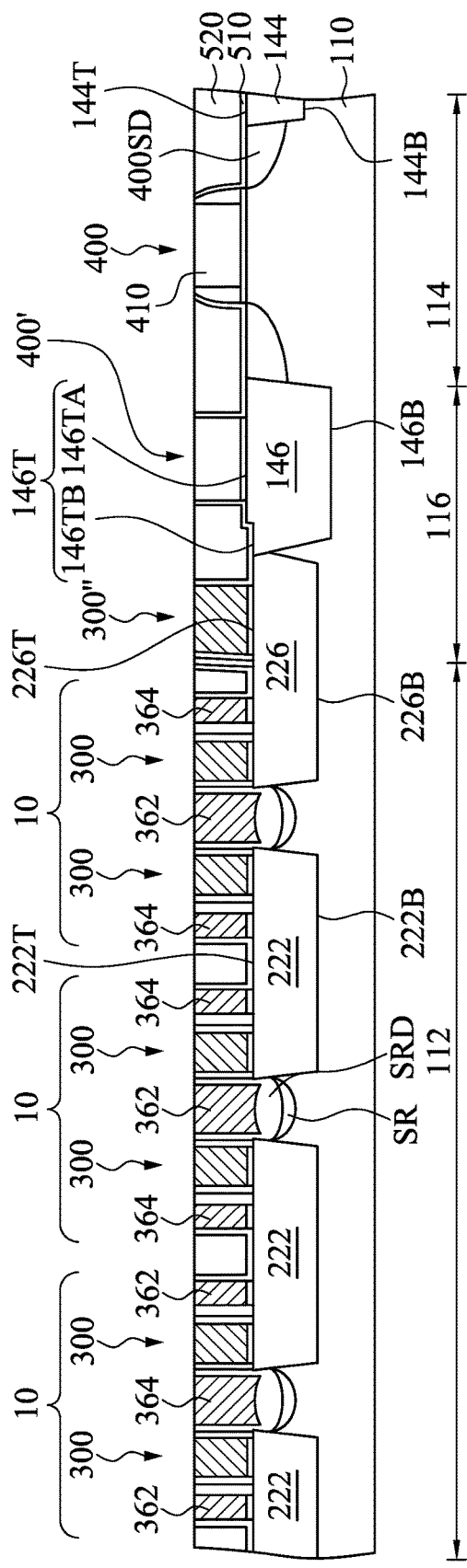
Figure 21C:
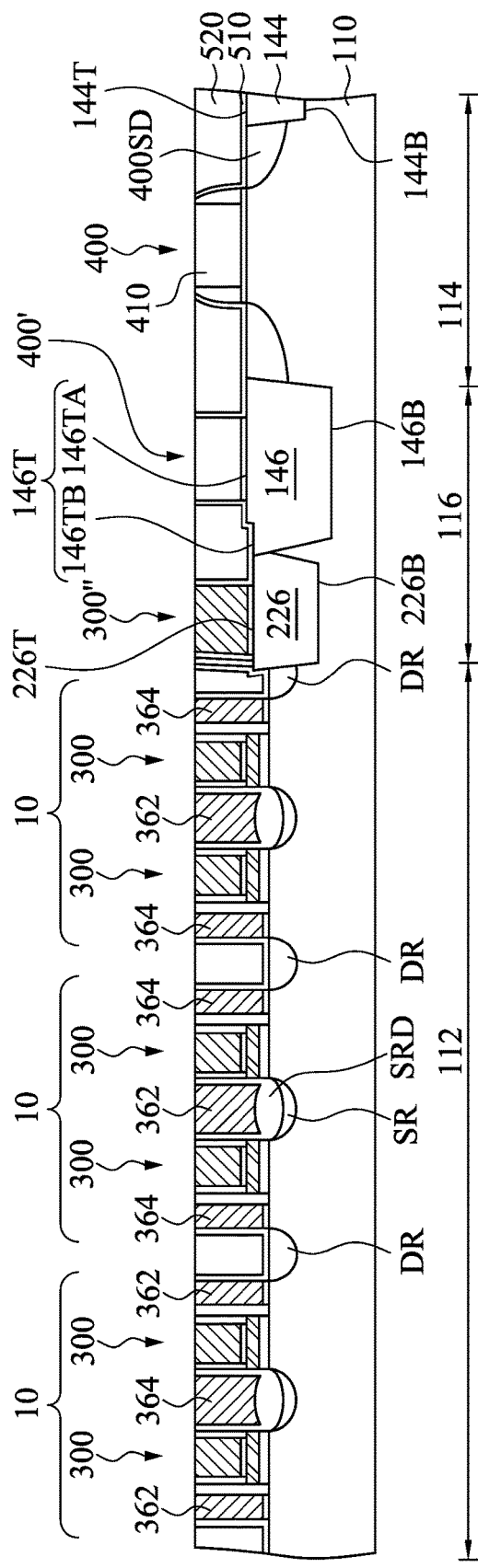

Referring to FIG. 1B and FIGS. 21A to 21C, where FIG. 21A is a top view of the semiconductor device, FIG. 21B is a cross-sectional view taking along line B-B of FIG. 21A, and FIG. 21C is a cross-sectional view taking along line C-C of FIG. 21A. The method M proceeds to step S20 where an etch stop layer and an interlayer dielectric layer are formed. In the present embodiments, an etching stop layer 510 is conformally formed over the structure of FIGS. 20A and 20B, and an interlayer dielectric (ILD) 520 is formed over the etching stop layer 510. Then, a chemical mechanical polish (CMP) process is performed to level the top surface of the ILD 520 with the top surfaces of the erase gates 364, the control gates 322, the select gates 362 of the memory cells 10 and a top surface of a gate stack 410 of the semiconductor device 400. In some embodiments, the gate stack 410 may include a gate dielectric, a work function metal layer over the gate dielectric, a metal over the work function metal layer. In some embodiments, the gate stack 410 may include a metal. As such, plural memory cells 10 are formed. At least one of the memory cells 10 includes two gate stacks 300, one erase gate 364, two select gate 362, one source region SR, and two drain region DR. Two adjacent memory cells 10 share one drain region DR.

In FIGS. 21A to 21C, the floating gates 192 of the memory cells 10 are formed without being planarized, such that the floating gates 192 are prevented from dishing and erosion issue caused by the planarization process, which in turn will prevent floating gates 192 in array center from being over-polished, and thereby improving the thickness uniformity of the floating gates in the array center and array edge. Therefore, the floating gates 192 of the memory cells 10 in the center and edges of the cell regions 112 have substantially the same thickness. In some embodiments, the tunneling layers 182 are formed by oxidation and therefore have a uniform thickness. That is, the tunneling layers 182 have substantially the same thickness. Through the configuration, the memory cells 10 may have substantially the same electrical characteristics, which results in high yield rate. The term "substantially" as used herein may be applied to modify any quantitative representation which could permissibly vary without resulting in a change in the basic function to which it is related. It is noted that the number of the memory cells 10 in FIGS. 21A to 21C is illustrative, and should not limit the present disclosure. In some other embodiments, the number of the memory cells 10 can be greater than three and arranged as an array.

In FIGS. 21B to 21C, the isolation features 146 and 226 in the transition region 116 are connected and form an isolation feature. The substrate 110 has a protrusion portion 116p between a first portion and a second portion of the isolation feature (e.g., between the isolation features 146 and 226). In some embodiments, a top surface 146T of the first portion of the isolation feature (e.g., the isolation feature 146) has a first part 146TA and a second part 146TB between the first part 146TA and the second portion of the isolation feature (e.g., the isolation feature 226). The second part 146TB may be lower than the first part 146TA. For example, the second part 146TB may be substantially level with a top surface 226T of the second portion of the isolation feature (e.g., the isolation feature 226) and a top surface 222T of the isolation feature 222. In some embodiments, the first part 146TA may be substantially level with a top surface 144T of the isolation feature 144.

In some embodiments, a bottom surface 146B of the first portion of the isolation feature (e.g., the isolation feature 146) and a bottom surface 226B of the second portion of the isolation feature (e.g., the isolation feature 226) are at different levels. In some embodiments, the dummy semiconductor device 400' is over the first part 146TA of the top surface 146T of the first portion of the isolation feature (e.g., the isolation feature 146), and the semiconductor stack 300'' is over the second portion of the isolation feature (e.g., the isolation feature 226).

FIGS. 22A to 22B are cross-sectional views of a semiconductor device in accordance with some embodiments. The cross-sectional positions of FIGS. 22A and 22B are respectively the same as the cross-sectional position of FIGS. 21B and 21C. The difference between the semiconductor device of FIGS. 22A to 22B and the semiconductor device of FIGS. 21B to 21C pertains to the profile of the isolation features 146 and 226. In the present embodiments, the trench 116T' (as shown in FIGS. 10A to 10C) expose the entire sidewalls of the isolation feature 146, and the isolation feature 226 formed in the trench 116T' is in contact with the sidewall of the isolation feature 146 without any portion of the substrate 110 intervening therebetween. The bottom surface 226B of the isolation feature 226 is higher than the bottom surface 146B of the isolation feature 146, and a step S is formed between the bottom surfaces 226B and 146B. Other relevant structural details of the semiconductor device of FIGS. 22A to 22B are similar to the semiconductor device of FIGS. 21A to 21C, and, therefore, a description in this regard will not be repeated hereinafter.

Figure 23A:
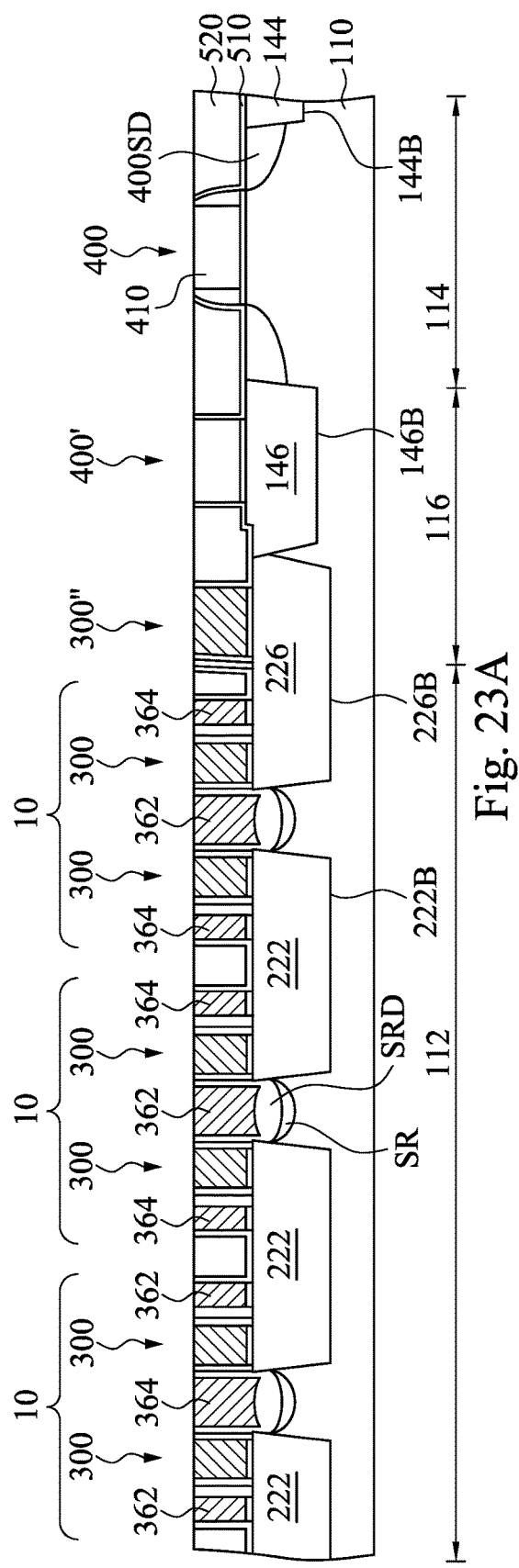
FIGS. 23A to 23B are cross-sectional views of a semiconductor device in accordance with some embodiments.
Figure 23B:
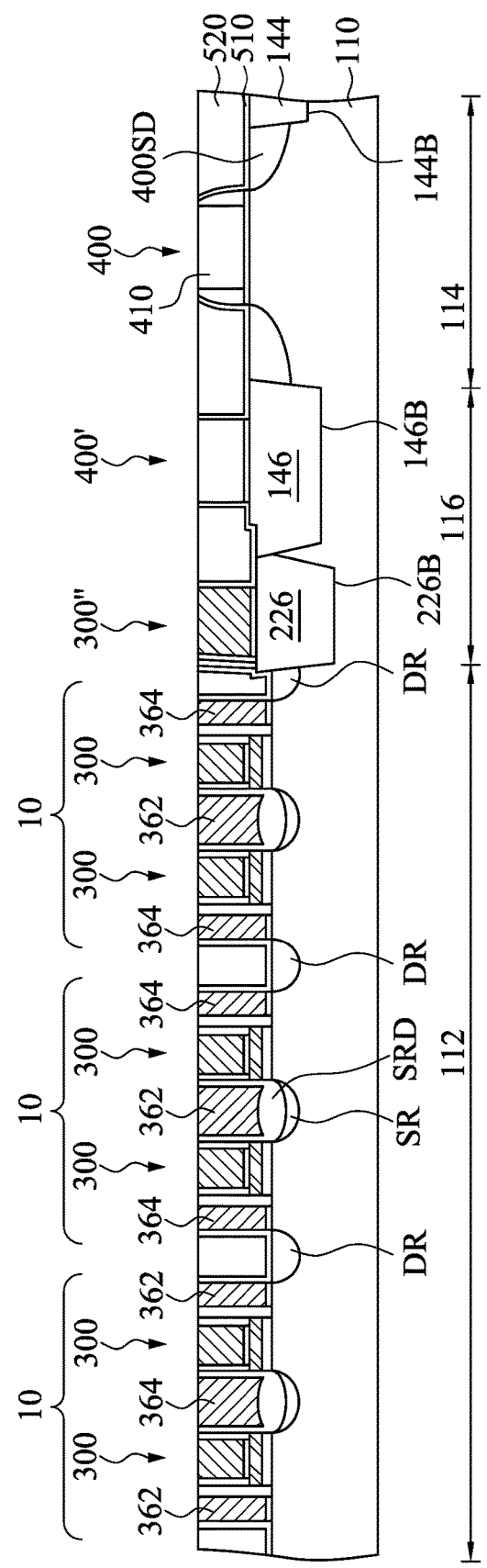

FIGS. 23A to 23B are cross-sectional views of a semiconductor device in accordance with some embodiments. The cross-sectional positions of FIGS. 23A and 23B are respectively the same as the cross-sectional position of FIGS. 21B and 21C. The difference between the semiconductor device of FIGS. 23A to 23B and the semiconductor device of FIGS. 21B to 21C is that: in the present embodiments, the bottom surfaces 144B and 146B of the isolation features 144 and 146 are higher than the bottom surfaces 222B and 226B of the isolation features 222 and 226. Other relevant structural details of the semiconductor device of FIGS. 23A to 23B are similar to the semiconductor device of FIGS. 21A to 21C, and, therefore, a description in this regard will not be repeated hereinafter.

Figure 24A:
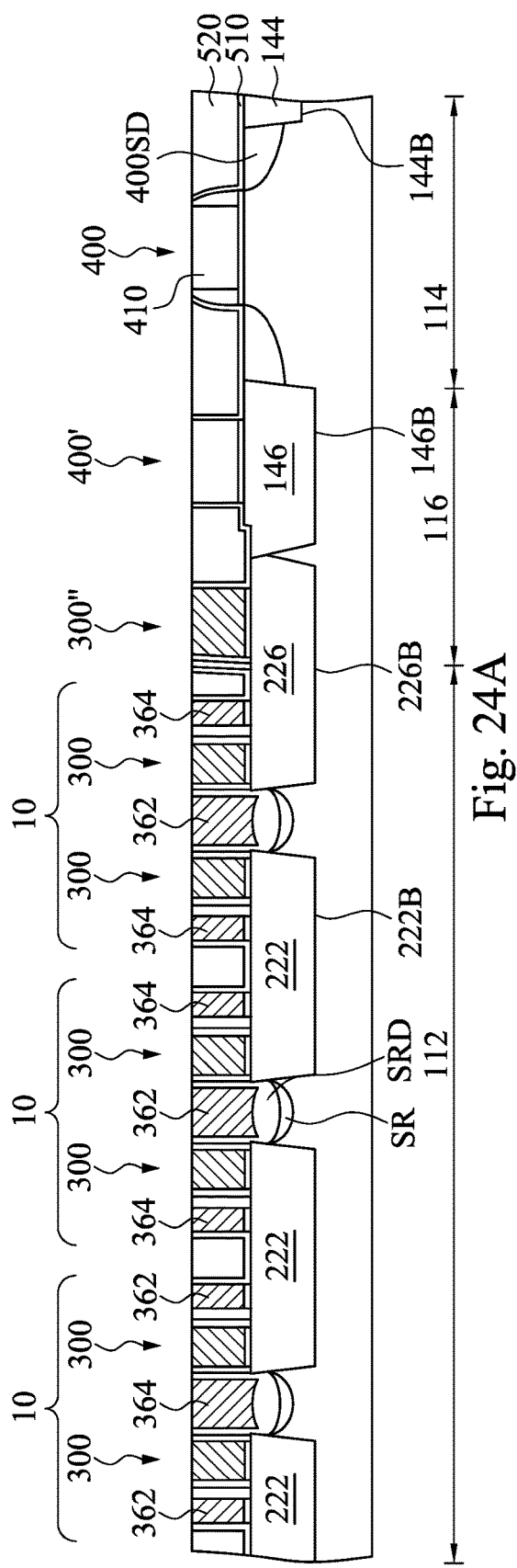
FIGS. 24A to 24B are cross-sectional views of a semiconductor device in accordance with some embodiments.
Figure 24B:
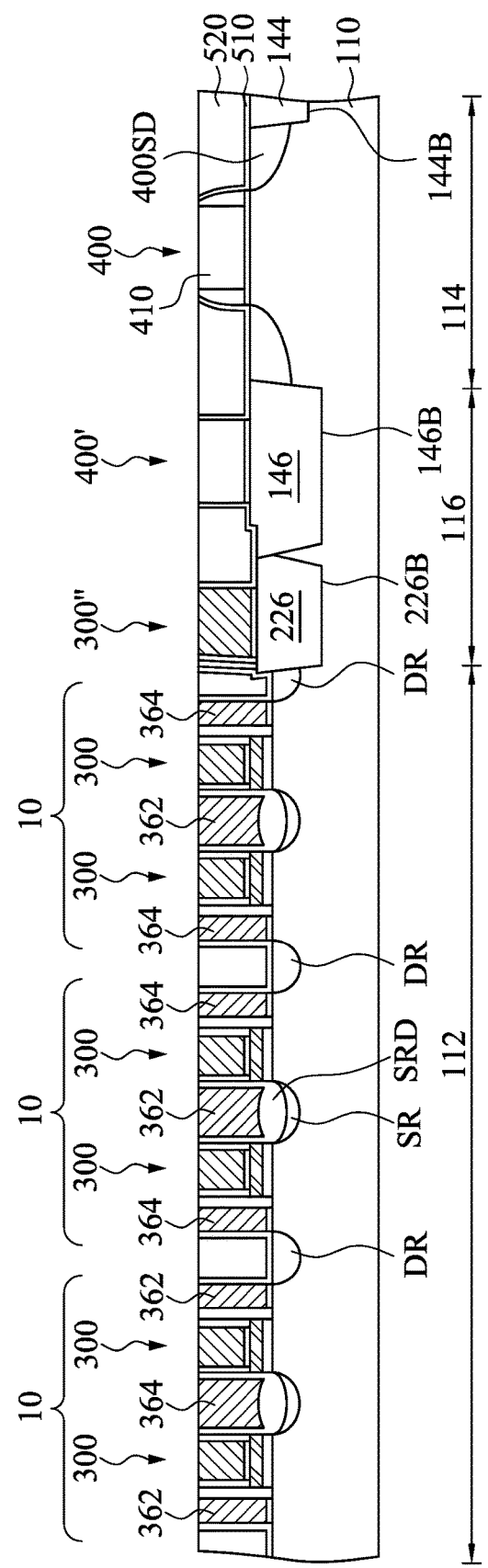

FIGS. 24A to 24B are cross-sectional views of a semiconductor device in accordance with some embodiments. The cross-sectional positions of FIGS. 24A and 24B are respectively the same as the cross-sectional position of FIGS. 21B and 21C. The difference between the semiconductor device of FIGS. 24A to 24B and the semiconductor device of FIGS. 21B to 21C is that: in the present embodiments, the bottom surface 146B of the isolation feature 146 is substantially level with the bottom surfaces 222B and 226B of the isolation features 222 and 226. Other relevant structural details of the semiconductor device of FIGS. 24A to 24B are similar to the semiconductor device of FIGS. 21A to 21C, and, therefore, a description in this regard will not be repeated hereinafter.

The present disclosure is applicable to fabrication of an embedded flash memory. Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the floating gates are formed without being planarized, such that the floating gates are prevented from dishing and erosion issue caused by the planarization process, which in turn will prevent floating gates in array center from being over-polished, and thereby improving the thickness uniformity of the floating gates in the array center and array edge and increasing yield rate. Another advantage is that a patterned hard mask used for protecting the peripheral region during the substrate recessing process may also be used for protects the peripheral region in other processes (e.g., oxidizing the surface layer of the substrate to form tunneling layer, patterning the floating gate layer, forming the trenches in the cell region, and/or recessing the isolation features), thereby saving the number of masks.

According to some embodiments, an integrated circuit device includes a substrate, an isolation feature, a memory cell, and a semiconductor device. The substrate has a cell region, a peripheral region, and a transition region between the cell region and the peripheral region. The isolation feature is in the transition region. A top surface of the isolation feature has a first portion and a second portion lower than the first portion, the second portion of the top surface of the isolation feature is between the cell region and the first portion of the top surface of the isolation feature, and a bottom surface of the isolation feature has a step height directly below the second portion of the top surface of the isolation feature. The is memory cell over the cell region of the substrate. The semiconductor device is over the peripheral region of the substrate.

According to some embodiments, an integrated circuit device includes a substrate, an isolation feature, a memory cell, a semiconductor device, and an interlayer dielectric layer. The substrate has a cell region, a peripheral region, and a transition region between the cell region and the peripheral region. The isolation feature is in the transition region, wherein a bottom surface of the isolation feature has a step height. The memory cell is over the cell region of the substrate. The semiconductor device is over the peripheral region of the substrate. The interlayer dielectric layer is over the isolation feature. A bottom surface of the interlayer dielectric layer has a first portion and a second portion lower than the first portion of the bottom surface of the interlayer dielectric layer, and the step height of the bottom surface of the isolation feature is directly below the second portion of the bottom surface of the interlayer dielectric layer.

According to some embodiments, an integrated circuit device includes a substrate having a cell region, a peripheral region, and a transition region between the cell region and the peripheral region; a first isolation feature in the transition region, wherein a bottom surface of the first isolation feature has a first portion, a second portion between the cell region and the first portion, and a step height connecting the first portion to the second portion, a top surface of the first isolation feature has a first portion, a second portion lower than the first portion of the top surface of the first isolation feature, and a connecting portion connecting the first portion of the top surface of the first isolation feature to the second portion of the top surface of the first isolation feature, and the connecting portion of the top surface of the first isolation feature vertically overlaps the first portion of the bottom surface of the first isolation feature; a memory cell over the cell region of the substrate; and a semiconductor device over the peripheral region of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device, comprising:
a substrate having a cell region, a peripheral region, and a transition region between the cell region and the peripheral region;
an isolation feature in the transition region, wherein a top surface of the isolation feature has a first portion and a second portion lower than the first portion, the second portion of the top surface of the isolation feature is between the cell region and the first portion of the top surface of the isolation feature, and a bottom surface of the isolation feature has a step directly below the second portion of the top surface of the isolation feature;
a memory cell over the cell region of the substrate; and
a semiconductor device over the peripheral region of the substrate.

2. The integrated circuit device of claim 1, wherein the bottom surface of the isolation feature has a first portion and a second portion higher than the first portion of the bottom surface of the isolation feature, and the second portion of the bottom surface of the isolation feature is between the cell region and the first portion of the bottom surface of the isolation feature.

3. The integrated circuit device of claim 1, wherein a top surface of the cell region of the substrate is lower than a top surface of the peripheral region of the substrate.

4. The integrated circuit device of claim 1, wherein the second portion of the top surface of the isolation feature is lower than a top surface of the peripheral region of the substrate and higher than a top surface of the cell region of the substrate.

5. The integrated circuit device of claim 1, further comprising:
a dummy semiconductor device over the first portion of the top surface of the isolation feature;
a semiconductor stack over the second portion of the top surface of the isolation feature; and
an interlayer dielectric layer over the top surface of the isolation feature, wherein the interlayer dielectric layer has a portion between the dummy semiconductor device and the semiconductor stack, and the step of the bottom surface of the isolation feature is directly below the portion of the interlayer dielectric layer.

6. The integrated circuit device of claim 1, wherein the top surface of the isolation feature has a connecting portion connecting the first portion of the top surface of the isolation feature to the second portion of the top surface of the isolation feature, and the connecting portion of the top surface of the isolation feature vertically overlaps a portion of the bottom surface of the isolation feature between the step and the peripheral region.

7. The integrated circuit device of claim 1, further comprising:
an etch stop layer extending over the first and second portions of the top surface of the isolation feature.

8. The integrated circuit device of claim 1, wherein the isolation feature has an interface extending from the step of the bottom surface of the isolation feature to the second portion of the top surface of the isolation feature.

9. An integrated circuit device, comprising:
a substrate having a cell region, a peripheral region, and a transition region between the cell region and the peripheral region;
an isolation feature in the transition region, wherein a bottom surface of the isolation feature has a step;
a memory cell over the cell region of the substrate;
a semiconductor device over the peripheral region of the substrate; and
an interlayer dielectric layer over the isolation feature, wherein a bottom surface of the interlayer dielectric layer has a first portion and a second portion lower than the first portion of the bottom surface of the interlayer dielectric layer, and the step of the bottom surface of the isolation feature is directly below the second portion of the bottom surface of the interlayer dielectric layer.

10. The integrated circuit device of claim 9, further comprising:
a dummy semiconductor device over the isolation feature; and
a semiconductor stack over the isolation feature, wherein the interlayer dielectric layer spaces the semiconductor stack from the dummy semiconductor device.

11. The integrated circuit device of claim 10, wherein the semiconductor stack comprises a same gate electrode material as a select gate of the memory cell.

12. The integrated circuit device of claim 10, wherein the dummy semiconductor device comprises a same metal material as the semiconductor device.

13. The integrated circuit device of claim 9, further comprising:
an etch stop layer spacing the first and second portions of the bottom surface of the interlayer dielectric layer from the isolation feature.

14. The integrated circuit device of claim 13, wherein the isolation feature has an interface extending from the step of the bottom surface of the isolation feature to the etch stop layer.

15. An integrated circuit device, comprising:
a substrate having a cell region, a peripheral region, and a transition region between the cell region and the peripheral region;
a first isolation feature in the transition region, wherein a bottom surface of the first isolation feature has a first portion, a second portion between the cell region and the first portion, and a step connecting the first portion to the second portion, a top surface of the first isolation feature has a first portion, a second portion lower than the first portion of the top surface of the first isolation feature, and a connecting portion connecting the first portion of the top surface of the first isolation feature to the second portion of the top surface of the first isolation feature, and the connecting portion of the top surface of the first isolation feature vertically overlaps the first portion of the bottom surface of the first isolation feature;
a memory cell over the cell region of the substrate; and
a semiconductor device over the peripheral region of the substrate.

16. The integrated circuit device of claim 15, wherein the first and second portions of the bottom surface of the first isolation feature are at different levels.

17. The integrated circuit device of claim 15, further comprising:
a dummy semiconductor device over the first portion of the top surface of the first isolation feature, wherein the dummy semiconductor device comprises a same metal material as the semiconductor device.

18. The integrated circuit device of claim 15, further comprising:
a semiconductor stack over the second portion of the top surface of the first isolation feature, wherein the semiconductor stack comprises a same gate electrode material as a select gate of the memory cell.

19. The integrated circuit device of claim 15, further comprises:
a second isolation feature in the cell region, wherein a bottom surface of the second isolation feature is substantially level with the second portion of the bottom surface of the first isolation feature.

20. The integrated circuit device of claim 15, further comprises:
a third isolation feature in the peripheral region, wherein a bottom surface of the third isolation feature is substantially level with the first portion of the bottom surface of the first isolation feature.

* * * * *